United States Patent
Kurayama

(10) Patent No.: US 7,853,849 B2
(45) Date of Patent: Dec. 14, 2010

(54) HIGH-SPEED SERIAL TRANSFER DEVICE TEST METHOD, PROGRAM, AND DEVICE

(75) Inventor: Tetsuo Kurayama, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 1027 days.

(21) Appl. No.: 11/398,615

(22) Filed: Apr. 6, 2006

(65) Prior Publication Data
US 2007/0162807 A1 Jul. 12, 2007

(30) Foreign Application Priority Data
Dec. 15, 2005 (JP) .............................. 2005-361340

(51) Int. Cl.
*G01R 31/28* (2006.01)
*G06F 11/00* (2006.01)

(52) U.S. Cl. .................... 714/738; 714/798

(58) Field of Classification Search .............. 714/700, 714/738, 744, 799, 798, 707, 701, 821, 823
See application file for complete search history.

(56) References Cited

U.S. PATENT DOCUMENTS

| | | | | |
|---|---|---|---|---|
| 4,788,684 A | * | 11/1988 | Kawaguchi et al. | ......... 714/719 |
| 5,970,073 A | * | 10/1999 | Masuda et al. | ............... 714/738 |
| 6,094,737 A | * | 7/2000 | Fukasawa | .................... 714/738 |
| 6,680,970 B1 | | 1/2004 | Mejia | |
| 2002/0018492 A1 | | 2/2002 | Sakai et al. | |
| 2004/0042544 A1 | | 3/2004 | Mejia | |

FOREIGN PATENT DOCUMENTS

| | | |
|---|---|---|
| JP | 02-162823 | 6/1990 |
| JP | 2000-330918 | 11/2000 |
| JP | 2002-051033 | 2/2002 |
| JP | 2002-084247 | 3/2002 |

OTHER PUBLICATIONS

Japanese Patent Office Action mailed Apr. 3, 2007, in Japanese Application No. 2006-527215.
"What is a pseudorandom number sequence?", URL: http://infohost.nmt.edu/tcc/help/lang/fortran/pseudo.html, Dec. 19, 2005.

* cited by examiner

*Primary Examiner*—Phung M Chung
(74) *Attorney, Agent, or Firm*—Staas & Halsey LLP

(57) ABSTRACT

A test pattern generating unit generates a test pattern in which unconverted data is arranged such that same values of 0 or 1 bits in converted data according to a code conversion table are successively transferred to each of a plurality of serial transfer channels that a high-speed serial transfer device has. A basic pattern setting unit sets a basic pattern while considering a byte order method and an RD value of code conversion in the high-speed serial transfer device. A basic pattern resetting unit resets the basic pattern in accordance with a channel usage method of a bit transfer order in the high-speed serial transfer device. A basic pattern rearranging unit performs rearrangement such that the basic pattern is transferred to each of the channels in accordance with the number of used channels and a channel usage method such as bit transfer order in the high-speed serial transfer device.

12 Claims, 35 Drawing Sheets

FIG. 2

| ITEM | DISPLAY TYPE | REMARKS |
|---|---|---|
| CONVERSION METHOD | CHARACTER TYPE | 1b/2b, 3b/4b, 4b/5b, 5b/6b, 8b/10b, etc. |
| INPUT DATA | CHARACTER TYPE | THOSE TO BE CONVERTED. E.G.) 0x00, 0x01, ···, 0xFF IN 8b/10b CONVERSION |
| CONVERTED BIT SEQUENCE (RD−) | NUMERICAL TYPE | SEQUENCES ARE PREPARED IN ONLY THE NUMBER OF BITS OF CONVERTED DATA, AND BINARY VALUE IS STORED FOR EACH ELEMENT |
| CONVERTED BIT SEQUENCE (RD+) | NUMERICAL TYPE | SAME |
| RD CONVERSION SWITCH PRESENCE | NUMERICAL TYPE | DETERMINE WHETHER THE NUMBER OF 0s AND 1s IS THE SAME OR NOT IN 10b CODE (*1) |

| ITEM | DESCRIPTION |
|---|---|
| CONVERSION METHOD | 1b/2b, 3b/4b, 4b/5b, 5b/6b, 8b/10b |
| NUMBER OF CONVERSION | NUMBER OF CONVERSION.<br>E.G.) 256 PATTERNS IN 8b/10b (WHEN CONVERSION OF RD± IS TAKEN INTO CONSIDERATION, 256×2=512 PATTERNS) |
| MAXIMUM RL | MAXIMUM RL ACCORDING TO SPEC<br>E.G.) 5 IN 8b/10b CONVERSION |
| MAXIMUM RL IN ONE CONVERSION UNIT | 0 (DEFAULT)<br>E.G.) 4 IN 8b/10b |
| MAXIMUM NUMBER OF CONTINUOUS SAME VALUES IN a-SIDE OF RD+ CONVERSION | 0 (DEFAULT)<br>E.G.) 3 IN 8b/10b |
| MAXIMUM NUMBER OF CONTINUOUS SAME VALUES IN j-SIDE OF RD+ CONVERSION | 0 (DEFAULT)<br>E.G.) 3 IN 8b/10b |
| MAXIMUM NUMBER OF CONTINUOUS SAME VALUES IN a-SIDE OF RD− CONVERSION | 0 (DEFAULT)<br>E.G.) 3 IN 8b/10b |
| MAXIMUM NUMBER OF CONTINUOUS SAME VALUES IN j-SIDE OF RD− CONVERSION | 0 (DEFAULT)<br>E.G.) 3 IN 8b/10b |

| CODE GROUP NAME | OCTET VALUE (HEXADECIMAL NUMBER) | OCTET BIT HGF EDCBA | RD- CONVERSION a b c d e i   f g h j | RD+ CONVERSION a b c d e i   f g h j |
|---|---|---|---|---|
| D0.0 | 00 | 000 00000 | 100111 0100 | 011000 1011 |
| D1.0 | 01 | 000 00001 | 011101 0100 | 100010 1011 |
| D2.0 | 02 | 000 00010 | 101101 0100 | 010010 1011 |
| D3.0 | 03 | 000 00011 | 110001 1011 | 110001 0100 |
| D4.0 | 04 | 000 00100 | 110101 0100 | 001010 1011 |
| D5.0 | 05 | 000 00101 | 101001 1011 | 101001 0100 |
| D6.0 | 06 | 000 00110 | 011001 1011 | 011001 0100 |
| D7.0 | 07 | 000 00111 | 111000 1011 | 000111 0100 |
| D8.0 | 08 | 000 01000 | 111001 0100 | 000110 1011 |
| D9.0 | 09 | 000 01001 | 100101 1011 | 100101 0100 |
| D10.0 | 0A | 000 01010 | 010101 1011 | 010101 0100 |
| D11.0 | 0B | 000 01011 | 110100 1011 | 110100 0100 |
| D12.0 | 0C | 000 01100 | 001101 1011 | 001101 0100 |
| D13.0 | 0D | 000 01101 | 101100 1011 | 101100 0100 |
| D14.0 | 0E | 000 01110 | 011100 1011 | 011100 0100 |
| D15.0 | 0F | 000 01111 | 010111 0100 | 101000 1011 |

| BYTE ORDER | | (LSB) | | | | 10b BIT SEQUENCE NUMBER | | | | (MSB) |
|---|---|---|---|---|---|---|---|---|---|---|
| | LITTLE | ... | BIT 6 | BIT 7 | BIT 8 | BIT 9 | BIT 0 | BIT 1 | BIT 2 | BIT 3 |
| | BIG | ... | BIT 3 | BIT 2 | BIT 1 | BIT 0 | BIT 9 | BIT 8 | BIT 7 | BIT 6 |
| PATTERN 1 (F4EB LITTLE) | | ... | 0 | 1 | 1 | 1 | 1 | 1 | 0 | ... |
| PATTERN 2 (EBF4 BIG) | | ... | ... | 0 | 1 | 1 | 1 | 1 | 1 | 0 |
| PATTERN 3 (EBF4 LITTLE) | | ... | 1 | 0 | 0 | 0 | 0 | 0 | 1 | ... |
| PATTERN 4 (F4EB BIG) | | ... | ... | 1 | 0 | 0 | 0 | 0 | 0 | 1 |

122 (WHEN RL=5 IN 8b/10b CONVERSION)

| CASE | STATE OF VARIATION OF RD VALUE | CONDITIONS OF X AND Y DATA |
|---|---|---|
| 1 | (X:RD+)(Y:RD−)(X:RD−)(Y:RD+)... | X: THERE IS DIFFERENCE IN NUMBER OF "0" AND "1" OF CONVERTED DATA. |
| 2 | (X:RD−)(Y:RD+)(X:RD+)(Y:RD−)... | Y: THERE IS NO DIFFERENCE IN NUMBER OF "0" AND "1" OF CONVERTED DATA. |
| 3 | (X:RD+)(Y:RD+)(X:RD−)(Y:RD−)... | X: THERE IS NO DIFFERENCE IN NUMBER OF "0" AND "1" OF CONVERTED DATA. |
| 4 | (X:RD−)(Y:RD−)(X:RD+)(Y:RD+)... | Y: THERE IS DIFFERENCE IN NUMBER OF "0" AND "1" OF CONVERTED DATA. |
| 5 | (X:RD+)(Y:RD−)... | X: THERE IS DIFFERENCE IN NUMBER OF "0" AND "1" OF CONVERTED DATA. |
| 6 | (X:RD−)(Y:RD+)... | Y: THERE IS DIFFERENCE IN NUMBER OF "0" AND "1" OF CONVERTED DATA. |
| 7 | (X:RD+)(Y:RD+)... | X: THERE IS NO DIFFERENCE IN NUMBER OF "0" AND "1" OF CONVERTED DATA. |
| 8 | (X:RD−)(Y:RD−)... | Y: THERE IS NO DIFFERENCE IN NUMBER OF "0" AND "1" OF CONVERTED DATA. |

FIG. 13

ODD-NUMBERED BIT

| BIT POSITION | 1th | 3th | 5th | 7th | 9th | 11th | 13th | 15th |
|---|---|---|---|---|---|---|---|---|
| VALUE | 1 | 1 | 1 | 0 | 1 | 0 | 0 | 1 |
| DATA | | | | 0xE9 | | | | |

EVEN-NUMBERED BIT

| 0th | 2th | 4th | 6th | 8th | 10th | 12th | 14th |
|---|---|---|---|---|---|---|---|
| 1 | 1 | 0 | 0 | 1 | 1 | 1 | 1 |
| | | | 0xCF | | | | |

FIG. 28

(WHEN RL=5 IN 8b/10b CONVERSION)

| CASE | STATE OF VARIATION OF RD VALUE | PROBLEM IN OCCURRENCE OF RL=5 |
|---|---|---|
| 1 | (X:RD+)(Y:RD−)(X:RD−)(Y:RD+)... | EVEN WHEN RL=5 IS OBTAINED AT BOUNDARY OF EITHER (X:RD+)(Y:RD−) OR (X:RD−)(Y:RD+), ONE RL=5 IS ALWAYS OBTAINED BY XYXY. |
| 2 | (X:RD−)(Y:RD+)(X:RD+)(Y:RD−)... | |
| 3 | (X:RD+)(Y:RD+)(X:RD−)(Y:RD−)... | EVEN WHEN RL=5 IS OBTAINED AT BOUNDARY OF EITHER (Y:RD+)(X:RD−) OR (Y:RD−)(X:RD+), ONE RL=5 IS ALWAYS OBTAINED BY XYXY. |
| 4 | (X:RD−)(Y:RD−)(X:RD+)(Y:RD+)... | |
| 5 | (X:RD+)(Y:RD−)... | WHEN RL=5 IS OBTAINED AT BOUNDARY OF (X:RD−)(Y:RD−), RL=5 CANNOT BE OBTAINED EVEN IF INFINITE NUMBER OF XY DATA IS CAUSED TO FLOW. |
| 6 | (X:RD−)(Y:RD+)... | WHEN RL=5 IS OBTAINED AT BOUNDARY OF (X:RD+)(Y:RD−), RL=5 CANNOT BE OBTAINED EVEN IF INFINITE NUMBER OF XY DATA IS CAUSED TO FLOW. |
| 7 | (X:RD+)(Y:RD+)... | WHEN RL=5 IS OBTAINED AT BOUNDARY OF (X:RD−)(Y:RD+), RL=5 CANNOT BE OBTAINED EVEN IF INFINITE NUMBER OF XY DATA IS CAUSED TO FLOW. |
| 8 | (X:RD−)(Y:RD−)... | WHEN RL=5 IS OBTAINED AT BOUNDARY OF (X:RD+)(Y:RD+), RL=5 CANNOT BE OBTAINED EVEN IF INFINITE NUMBER OF XY DATA IS CAUSED TO FLOW. |

* THE EXPRESSION "(X:RD+)" MEANS THAT DATA X HAS UNDERGONE RD+ CONVERSION.

FIG. 29

| CASE | STATE OF VARIATION OF RD VALUE WITH GENERATED PATTERN XYZ |
|---|---|
| 5 | (X:RD+)(Y:RD+)(Z:RD+)(X:RD−)(Y:RD+)(Z:RD−)… |
| 6 | (X:RD−)(Y:RD+)(Z:RD+)(X:RD+)(Y:RD−)(Z:RD+)… |
| 7 | (X:RD+)(Y:RD+)(Z:RD+)(X:RD−)(Y:RD−)(Z:RD−)… |
| 8 | (X:RD−)(Y:RD−)(Z:RD−)(X:RD+)(Y:RD+)(Z:RD+)… |

FIG. 32

| 8b DATA | 10b DATA (RD−) | 10b DATA (RD+) | DESCRIPTION |
|---|---|---|---|
| 0x00<br>0x01<br>0x02<br>0x04<br>.. | GROUP G4/G1 | GROUP G1/G4 | RD VALUE IS NOT CHANGED, THAT IS, THE NUMBER OF 1s AND 0s AFTER 10b CONVERSION IS THE SAME. (133 VARIATIONS) |
| 0x03<br>0x05<br>.. | GROUP G2 (GROUP G3) | | RD VALUE IS CHANGED, THAT IS, THE NUMBER OF 1s AND 0s AFTER 10b CONVERSION IS DIFFERENT. (123 VARIATIONS) |

28

HIGH-SPEED SERIAL TRANSFER DEVICE TEST METHOD, PROGRAM, AND DEVICE

This application is a priority based on prior application No. JP 2005-361340, filed Dec. 15, 2005, in Japan.

BACKGROUND OF THE INVENTION

1. Field of the Invention

The present invention relates to high-speed serial transfer device test method, program, and device which examine mis-synchronization failure of a high-speed serial transfer device; and particularly, relates to high-speed serial transfer device test method, program, and device which generate a test pattern in which same values are continued in serial transfer data which has undergone code conversion from the test pattern and successively transfer the data.

2. Description of the Related Arts

Conventionally, in a high-speed data transmission system such as Ethernet (R), gigabit-order high-speed data transfer is realized by use of high-speed serial transfer devices. In systems and devices using high-speed serial transfer devices, mis-synchronization and garbled-bit failure associated with it (hereinafter, referred to as "mis-synchronization") is known to have a high percentage among device failure caused by the high-speed serial transfer devices. A PLL circuit is incorporated in the high-speed serial transfer device, and a synchronized state is maintained when the PLL circuit detects synchronization loss between received data and clock at the timing of bit change in the received data, and feeds back the synchronization loss. As described above, the timing for detecting and feeding back synchronization loss in the PLL circuit is at the timing of bit change in the received data; therefore, as long as the same values which are 0 or 1 bits are continued, the feed-back function of the PLL circuit for synchronization loss does not work. Consequently, in the high-speed serial transfer devices having low tolerance, margin, or the like with respect to frequency deviation, when the same values are continued, the data and the clock lose synchronization to an extent that signals cannot be normally reproduced, thereby causing mis-synchronization to occur. Among the high-speed serial transfer devices which have passed tests as single parts and been shipped out, some of them having low tolerance or a margin with respect to frequency deviation when mounted on a device sometimes cause mis-synchronization, etc. since noise, etc. from the entire device also affects. Therefore, tests with respect to mis-synchronization have to be effectively performed in a state in which the high-speed serial transfer device is mounted on a device or in an operating state. Conventionally, the test for examining mis-synchronization, etc. can be performed by use of a PRBS pattern (Pseudo-random Binary Sequence: pseudo-random sequential pattern) which corresponds to benchmark testing for high-speed serial transfer.

[Patent Document 1] Japanese Patent Application Laid-Open (kokai) No. 2002-084247
[Patent Document 2] Japanese Patent Application Laid-Open (kokai) No. 2002-051033
[Patent Document 3] Japanese Patent Publication (kokoku) No. H07-028211
[Patent Document 4] Title: What is a pseudorandom number sequence URL: http://infohost.nmt.edu/tcc/help/lang/fortran/pseudo.html However, such conventional tests for examining mis-synchronization has a problem that they require a long period of time in many cases. One reason thereof is that the test is not performed by use of a pattern which is targeting on detection of mis-synchronization of the high-speed serial transfer device. Also the test using the PRBS pattern corresponding to a benchmark test for high-speed serial transfer devices cannot be considered as an effective test for mis-synchronization and the like since the pattern is not particularly specialized for detection of mis-synchronization and the like. of the high-speed serial transfer device. Therefore, when devices involving mis-synchronization of high-speed serial transfer devices pass mass-production tests and cause failure in the field even though the high-speed serial transfer devices have passed tests as single parts and been shipped out, actions such as collection, investigation, repair, and maintenance take labor hours and time, thereby providing a factor of increased cost. In the high-speed serial transfer device, for example, serial transfer is performed after the transfer data is subjected to a code conversion; and for this code conversion, two different code conversion tables of RD− conversions and RD+ conversions are provided in accordance with running disparity RD (Running Disparity) for facilitating amplification of faint signals, and whether the conversion of the subsequent data will be an RD+ conversion or an RD− conversion is controlled depending on whether the number of 0 bits and 1 bits of the preceding converted data is the same or different. Therefore, as one function test of the high-speed serial transfer device, all of the converted data stored in the code conversion tables is desired to be sequentially caused to flow through transfer channels so as to test the function of the receiving side in the field. This test can be performed, for example if it is 8-bit/10-bit conversion, by causing 256 variations of 8-bit data to be successively flowed and converted. However, the code conversions of the high-speed serial transfer device include two different conversions, that is, RD+ conversions and RD− conversions, and which conversion is to be performed depends on the RD value of the converted data immediately preceding the test pattern. This depends on the state of the device at the moment, and cannot be externally specified. Therefore, even when 256 variations of 8-bit data are caused to flow successively, all the conversions of the code conversion tables in which RD+ conversions and RD− conversions are performed cannot be performed to transfer the converted data. Thereat, there has been no other way but to repeat causing the 256 variations of 8-bit data to flow continuously so as to achieve function examination which is statistically close to that using the all the converted data; which involves problems that the examination takes time, and the converted data which is not transferred remains although the amount thereof is small. An object of the present invention is to provide high-speed serial transfer device test method, program, and device which enable examination of mis-synchronization to be performed in a short period of time by generating a test pattern specialized for examination of mis-synchronization failure in a high-speed serial transfer device and successively transferring the pattern in a target device.

SUMMARY OF THE INVENTION

In addition, according to the present invention to provide high-speed serial transfer device test method, program, and device which enable examination of a function test to be performed in a short period of time by generating a test pattern which causes all of the converted data in code conversions of the high-speed serial transfer device to be transferred.

(High-speed Serial Transfer Device Test Method)

The present invention provides a high-speed serial transfer device test method. The high-speed serial transfer device test method of the present invention is characterized by having a test pattern generating step of generating a test pattern in which unconverted data is arranged such that same values of 0 or 1 bits in converted data according to a code conversion table are successively transferred to each of a plurality of serial transfer channels that a high-speed serial transfer device has; and a test step of examining mis-synchronization failure in a receiving side by inputting the test pattern to a high-speed serial transfer device of a transmitting side such that the pattern undergoes a code conversion, and successively transferring the converted data such that the data passes through the serial transfer channel.

Herein, the test pattern generating step has a basic pattern setting step of setting a basic pattern in consideration of a byte order method and running disparity (RD value) of the code conversion in the high-speed serial transfer device;

a basic pattern resetting step of resetting the basic pattern in accordance with a channel usage method of a bit transfer order in the high-speed serial transfer device; and a basic pattern rearranging step of performing rearrangement in accordance with a channel usage method such as a bit transfer order and the number of used channels in the high-speed serial transfer device such that the basic pattern is transferred to each of the channels.

The code conversion table used in the code conversion in the high-speed serial transfer device is an m-bit/n-bit code conversion table which converts m-bit data which is one conversion unit into n-bit data having a large bit number, and performs two conversions of an RD+ conversion in which running disparity in the converted data is positive and an RD− conversion in which the running disparity is negative; and the basic pattern setting step has a step of determining whether or not the converted data of the one conversion unit in the m-bit/n-bit code conversion table includes the number of continuous same values in which 0 or 1 bits equal to or more than a specified run length continues, a one-unit test pattern extracting step of, if the number of continuous same values equal to or more than the specified run length is included, extracting unconverted data as the test pattern whish satisfies the specified run length in one unit of the converted data, and a two-unit test pattern extracting step of, if the number of continuous same values equal to or more than the specified run length is not included, extracting two units of unconverted data as the test pattern which satisfies the specified run length at the boundary part where the two units of the converted data are combined.

In the two-unit test pattern extracting step, when the two units of unconverted data are (X) and (Y), the converted data of the data (X) is (X:RD−) and (X:RD+), and the converted data of the data Y is (Y:RD−) and (Y:RD+), respectively, variation of running disparity of the converted data in a data stream (XYXYXYXY . . . XY) obtained by cyclically successively transferring the two units of unconverted data (XY) is sorted into (1) a first case in which the variation of the running disparity of the converted data stream of a case, in which the number of 0 bits and 1 bits of the converted data of the data X is different and the number of 0 bits and 1 bits of the converted data of the data Y is the same, is a repetition of (X:RD+)(Y:RD−)(X:RD−)(Y:RD+), (2) a second case in which the variation of the running disparity of the converted data stream of a case, in which the number of 0 bits and 1 bits of the converted data of the data X is different and the number of 0 bits and 1 bits of the converted data of the data Y is the same, is a repetition of (X:RD−)(Y:RD+)(X:RD+)(Y:RD−), (3) a third case in which the variation of the running disparity of the converted data stream of a case, in which the number of 0 bits and 1 bits of the converted data of the data X is the same and the number of 0 bits and 1 bits of the converted data of the data Y is different, is a repetition of (X:RD+)(Y:RD+)(X:RD−)(Y:RD−), (4) a fourth case in which the variation of the running disparity of the converted data stream of a case, in which the number of 0 bits and 1 bits of the converted data of the data X is the same and the number of 0 bits and 1 bits of the converted data of the data Y is different, is a repetition of (X:RD−)(Y:RD−)(X:RD+)(Y:RD+), (5) a fifth case in which the variation of the running disparity of the converted data stream of a case, in which the number of 0 bits and 1 bits of the converted data of both the data X and Y is different, is a repetition of (X:RD+)(Y:RD−), (6) a sixth case in which the variation of the running disparity of the converted data stream of a case, in which the number of 0 bits and 1 bits of the converted data of both the data X and Y is different, is a repetition of (X:RD−)(Y:RD+), (7) a seventh case in which the variation of the running disparity of the converted data stream of a case, in which the number of 0 bits and 1 bits of the converted data of both the data X and Y is the same, is a repetition of (X:RD+)(Y:RD+), and (8) an eighth case in which the variation of the running disparity of the converted data stream of a case, in which the number of 0 bits and 1 bits of the converted data of both the data X and Y is the same, is a repetition of (X:RD−)(Y:RD−); and the two units of unconverted data which satisfy the specified RL at the boundary part are extracted as the test pattern separately in each of the cases.

In the two-unit test pattern extracting step, the two units of unconverted data which satisfy the specified RL at the boundary part of the two units of conversion data are extracted as the test pattern in a manner corresponding to each of a first byte order method (little endian method) which employs a bit sequence in which an end side has a lower significant bit in the high-speed serial transfer device and a second byte order method (big endian method) which employs a bit sequence in which the end side has a higher significant bit.

When the high-speed serial transfer device has an 8-bit/10-bit code conversion table (hereinafter, referred to as "8b/10b code conversion table") for the code conversion, in the two-unit test pattern extracting step, XY=F4EB or

XY=EBF4 in hexadecimal display is determined as the basic pattern.

In the basic pattern resetting step, the basic data is reset to data before bit transfer order control to provide the basic data such that the basic data enables the data transferred in accordance with the bit transfer order control in which transfer order is determined separately for odd-numbered bits and even-numbered bits in the high-speed serial transfer device to satisfy a specified run length.

For example, in the basic pattern resetting step, when, in the two-unit test pattern extracting step, XY=F4EB or
XY=EBF4 in hexadecimal display is determined as the basic pattern from an 8b/10b code conversion table of the high-speed serial transfer device, the basic pattern is reset in accordance with the bit transfer order control, in which odd-numbered bits are transferred first and even-numbered bits are subsequently transferred, to the reset basic pattern which is XY=E9CF or
XY=CFE9.

In the basic pattern rearranging step, the basic pattern (X) of one unit or the basic pattern (XY) of two units is rearranged such that the basic pattern is continued in the number of the channels of the high-speed serial transfer device.

In the basic pattern rearranging step, when the high-speed serial transfer device has four channels, the one-unit basic pattern (X) is rearranged to repetitions of the basic pattern (XXXX), and the two-unit basic pattern (XY) is rearranged to repetitions of the basic pattern (XXXXYYYY).

In the basic pattern resetting step, when, in the two-unit test pattern extracting step, (F4EB) or (EBF4) in hexadecimal display is determined as the basic pattern from an 8b/10b code conversion table of the high-speed serial transfer device, and when the high-speed serial transfer device has four channels, the basic pattern F4EB is rearranged to repetitions of the basic pattern (F4F4F4F4F4EBEBEBEBEB) or the basic pattern EBF4is rearranged to repetitions of the basic pattern (EBEBEBEBF4F4F4F4).

(Code Conversion Function Test Method)

In another mode of the present invention, a high-speed serial transfer device test method in which all converted data in code conversions is caused to flow from a high-speed serial transfer device is provided.

The high-speed serial transfer device test method of the present invention is characterized by having a test pattern generating step of generating a test pattern in which unconverted data is arranged such that all of converted data stored in a code conversion table is successively transferred to each of a plurality of serial transfer channels that a high-speed serial transfer device has; and a test step for examining a function of a receiving side by inputting the test pattern to a high-speed serial transfer device of a transmitting side such that the pattern undergoes a code conversion, and successively transferring all of the converted data of the code conversion table such that the data passes through the serial transfer channel.

The test pattern generating step has a group sorting step of sorting the code conversion table into an RD unchanged group in which the number of 0 bits and 1 bits of the converted data is the same and which does not causes running disparity of the subsequent converted data to be changed, and an RD changed group in which the number of 0 bits and 1 bits of the converted data is different and which causes running disparity of the subsequent converted data to be changed;

a test pattern allocating step of forming a first group by disposing units of the unconverted data of the RD unchanged group one by one, then forming a second group by disposing units of same data of the unconverted data of the RD unchanged group two by two, subsequently forming a third group by disposing merely one unit of predetermined unconverted data which belongs to the RD changed group, and further forming a fourth group by disposing the units of the unconverted data of the no RD group one by one, so as to generate the test pattern; and a test pattern rearranging step of rearranging the test pattern such that all the converted data is transferred to each of the channels in accordance with the number of used channels in the high-speed serial transfer device.

If the code conversion table is an 8b/10b code conversion table, in the group sorting step, the 8b/10b code conversion table is sorted into the RD unchanged group including 133 variations and the RD changed group including 123 variations; and, in the test pattern allocating step, the first group is formed by disposing units of 8-bit data of the 133 variations of the RD unchanged group one by one, the second group is then formed by disposing units of 8-bit data of the 123 variations of the RD changed group two by two, the third group is subsequently formed by disposing merely one unit of predetermined 8-bit data which belongs to the RD changed group, and the fourth group is formed by disposing units of 8-bit data of the 133 variations of the no RD group one by one, so as to generate the test pattern.

In the test pattern rearranging step, one unit of unconverted pattern (X) or two units of the unconverted pattern (XX) is rearranged such that the pattern of one unit is continued in the number of the channels in the high-speed serial transfer device.

(Program)

The present invention provides a test data generating program for generating a test data for examining mis-synchronization. The test data generating program of the present invention is characterized by causing a computer to execute a specifying information inputting step of reading specifying information of a conversion method of a code conversion table of a high-speed serial conversion device and specifying information of a run length with which same values of 0 or 1 bits are successively transferred in converted data according to the code conversion table; and a test pattern generating step of generating a test pattern in which unconverted data is arranged such that the same values of 0 or 1 bits having the specified run length in the converted data according to the code conversion table are successively transferred to each of a plurality of serial transfer channels that the high-speed serial transfer device has.

Moreover, the present invention provides a test data generating program for examining a code conversion function. The test data generating program of the present invention is characterized by causing a computer to execute a specifying information inputting step of reading specifying information of a conversion method of a code conversion table of a high-speed serial conversion device;

a test data generating step of generating a test pattern in which unconverted data is arranged such that all converted data stored in the code conversion table is successively transferred to each of a plurality of serial transfer channels that the high-speed serial transfer device has; and a test pattern rearranging step of performing rearrangement such that all the converted data is transferred to each of the channels in accordance with the number of used channels in the high-speed serial transfer device.

(Device)

The present invention provides a test data generating device for generating a test data for examining mis-synchronization. The test data generating device of the present invention is characterized by having a specifying information inputting unit for reading specifying information of a conversion method of a code conversion table of a high-speed serial conversion device and specifying information of a run length with which same values of 0 or 1 bits are successively transferred in converted data according to the code conversion table; and a test pattern generating unit for generating a test pattern in which unconverted data is arranged such that the same values of 0 or 1 bits having the specified run length in the converted data according to the code conversion table are successively transferred to each of a plurality of serial transfer channels that the high-speed serial transfer device has.

In addition, the present invention provides a test data generating device for a code conversion function test. The test data generating device of the present invention is characterized by having a specifying information inputting unit for reading specifying information of a conversion method of a code conversion table of a high-speed serial conversion device;

a test data generating unit for generating a test pattern in which unconverted data is arranged such that all converted data stored in the code conversion table is successively transferred to each of a plurality of serial transfer channels that the high-speed serial transfer device has; and a test data rearranging unit for rearranging the test pattern such that all the converted data is transferred to each of the channels in accordance with the number of used channels in the high-speed serial transfer device.

According to the present invention, a test specialized for examination of mis-synchronization failure can be performed and the mis-synchronization detection ability of the high-speed serial transfer device can be enhanced compared with conventional cases when converted data in which same values are continued is caused to flow through serial transfer channels by inputting a test pattern to a high-speed serial transfer device which is incorporated in a system or a device and the pattern is subjected to code conversions; therefore, a system or a device potentially involving mis-synchronization of the high-speed serial transfer device can be found at the stage of a test step. Therefore, devices potentially involving mis-synchronization or the like of the high-speed serial transfer devices are not shipped out, and field quality can be improved. In addition, since the test pattern specialized for examination of mis-synchronization failure is generated in accordance with the code conversion method, the byte order method, and the number of channels of the high-speed serial transfer device so as to perform a test, the test time for examining mis-synchronization failure can be significantly shortened, and the test man-hours and cost can be reduced. Even if mis-synchronization or the like of the high-speed serial transfer device occurs in the field, by virtue of the test using the test pattern which is generated according to the present invention and specialized for examination of mis-synchronization failure, the time of a reproduction test of the mis-synchronization failure can be shortened compared with conventional cases, and actions such as collection, investigation, repair, and maintenance can be appropriately and efficiently carried out. In addition, according to another mode of the present invention, all the RD− conversions and RD+ conversions can be performed through the conversion of one test pattern so as to the cause converted data to flow through serial transfer channels and to perform evaluation, by generating the test pattern which performs conversions of all the RD− conversions and RD+ conversions which are two conversion methods in the code conversion table used in the high-speed serial transfer device, without depending on the running disparity of the converted data which is immediately preceding the start the test. The above and other objects, features, and advantages of the present invention will become more apparent from the following detailed description with reference to the drawings.

BRIEF DESCRIPTION OF THE DRAWINGS

FIG. 2 is an explanatory diagram of the code conversion table of FIG. 1;

FIG. 3 is an explanatory diagram of the code conversion control table of FIG. 1;

FIGS. 4A and 4B are explanatory diagrams of the 8b/10b code conversion table used in code conversion of the high-speed serial transfer device;

FIG. 9 is an explanatory diagram separately showing, in accordance with the byte order methods, same-value continuous patterns each of which generated at the boundary part when two units of converted data in 8b/10b code conversion are combined;

FIG. 12 is an explanatory diagram showing, separately in cases, variation of an RD value in cyclically repeated transfer of two-unit converted data XY;

FIG. 13 is an explanatory diagram of the test pattern 0xF4EB obtained by subjecting the test pattern 0xF4EB to bit transfer order control;

FIG. 28 is an explanatory diagram showing, separately in cases, variation of the RD value and occurrence of RL=5 in the cases in which two-unit pattern XY is cyclically transferred;

FIG. 29 is an explanatory diagram of variation of the RD value when a three-unit pattern is cyclically transferred in the fifth to eighth cases of FIG. 28;

FIG. 32 is an explanatory diagram of usage regions of the 8b/10b code conversion table when the test pattern of FIGS. 31A to 31C are to be subjected to code conversion.

DETAILED DESCRIPTION OF THE PREFERRED EMBODIMENTS

Figure 1:
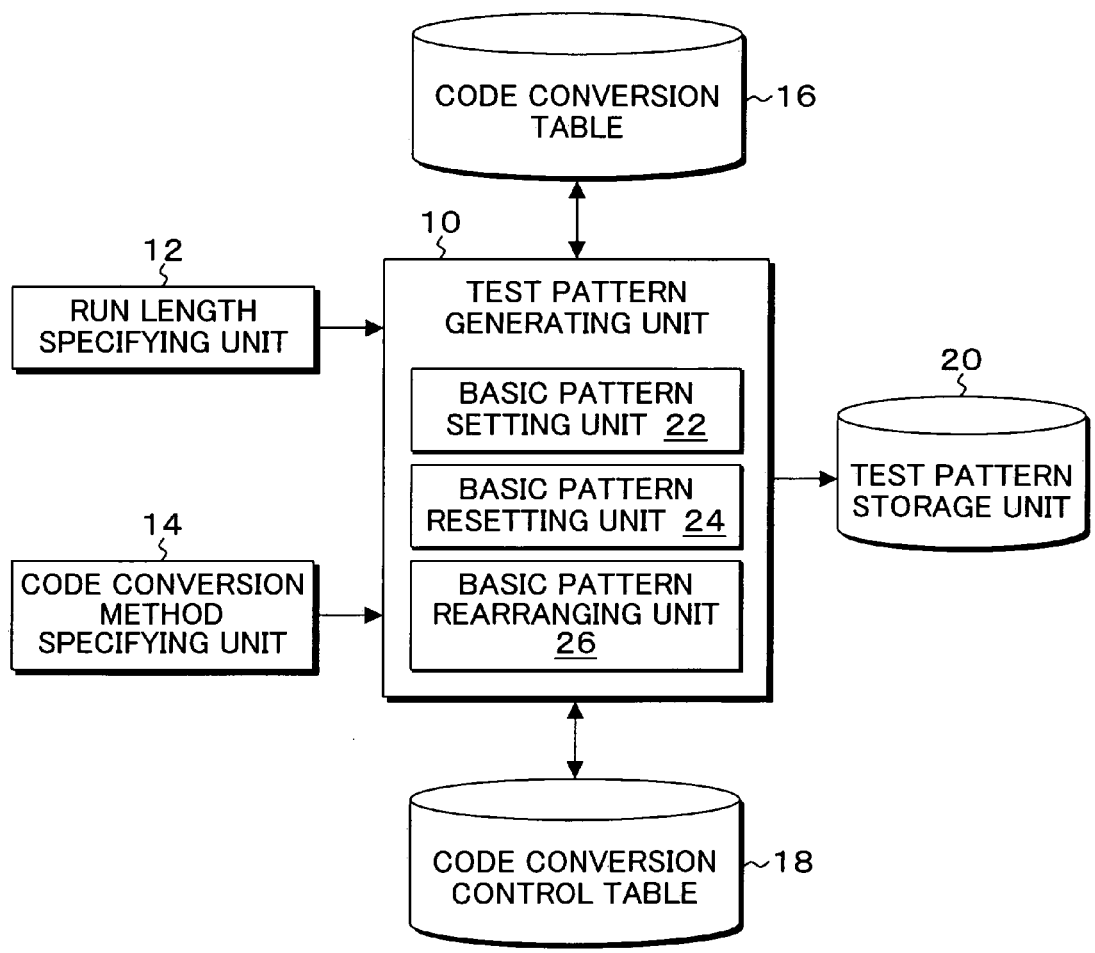
FIG. 1 is a block diagram of an embodiment of a test data generating device of the present invention which generates a test pattern for examining mis-synchronization failure.

FIG. 1 is a block diagram of an embodiment of a test data generating device of the present invention which generates a test pattern for examining mis-synchronization failure. In FIG. 1, the test data generating device of the present invention is comprised of a test pattern generating unit 10, a run length specifying unit 12, a code conversion method specifying unit 14, a code conversion table 16, a code conversion control table 18, and a test pattern storage unit 20. In the test pattern generating unit 10, a test pattern in which uncoverted data is arranged such that the same values of 0 or 1 bits of converted data according to the code conversion table are successively transferred to each of a plurality of serial transfer channels provided in a high-speed serial transfer device is generated. The test pattern generated in the test pattern generating unit 10 is input to a high-speed serial transfer device of the transmitting side and subjected to a code conversion, and the converted data is successively transferred so as to respectively pass through the plurality of serial transfer channels, thereby examining failure such as mis-synchronization and garbled bits accompanying it in a high-speed serial transfer device of the receiving side. In the test pattern generating unit 10, functions of a basic pattern setting unit 22, a basic pattern resetting unit 24, and a basic pattern rearranging unit 26 are provided. The basic pattern setting unit 22 takes into consideration the byte order method and the values of running disparity of code conversions (hereinafter, referred to as "RD values") in the high-speed serial transfer device so as to set basic patterns. The basic pattern resetting unit 24 resets the basic pattern in accordance with the channel usage method of the bit transfer order in the high-speed serial transfer device. Furthermore, in accordance with the channel usage method such as the bit transfer order or the used channel number in the high-speed serial transfer device, the basic pattern rearranging unit 26 performs rearrangement such that the basic pattern is successively transferred to the channels.

FIG. 2 is an explanatory diagram of the code conversion table 16 of FIG. 1. The code conversion table 16 is the code conversion table same as that used in the high-speed serial transfer device for which the test pattern is to be generated. The code conversion table 16 converts m-bit data of one conversion unit into n-bit data having a larger number of bits, as a conversion method, and has two pieces of converted data of a positive RD+ conversion wherein converted data has positive running disparity and a negative RD− conversion wherein it has negative running disparity. Specifically, the "conversion method" in the code conversion table 16 is, for example, 1b/2b, 3b/4b, 4b/5b, 5b/6b, or 8b/10b. The following description of this embodiment employs, as an example, the conversion method of 8b/10b, i.e., a conversion method in which 8-bit data of one conversion unit is converted into 10-bit data. The converted 10-bit data is either the converted data of the RD+ conversion or the converted data of the RD− conversion. "Input data" in the code conversion table 16 is the unconverted data to be converted; and, in 8b/10b code conversion, 256 variations of 8-bit data which is "0x00 , . . . , 0xFF" having octet values (hexadecimal numbers) are input data. In "converted bit sequences (RD−)", converted 10-bit data is prepared as addresses, and binary values are stored respectively for elements. This is also similar in "converted bit sequences (RD+)". "RD-conversion/switch presence" is a parameter for determining whether the number of 0 and the number of 1 are the same or not in a bit code of converted 10-bit data. Whether the number of 0 or 1 in this converted data is the same or different is the data required for switching the next code conversion between RD conversion and RD+ conversion, which point will be elucidated in later description.

FIG. 3 is an explanatory diagram of the code conversion control table 18 of FIG. 1. The code conversion control table 18 stores, as items, "conversion method", "number of conversions", "maximum RL", "maximum RL in one conversion unit" "maximum number of continuous same values in RD+ conversion a-side", "maximum number of continuous same values in RD+ conversion j-side", "maximum number of continuous same values in RD− conversion a-side", and "maximum number of continuous same values in RD− conversion j-side". The "conversion method" is same as that in the code conversion table 16 of FIG. 2. The "number of conversions" is the number of converted data with respect to input data. The number is in 256×2=512 patterns since the input data is in 256 patterns in 8b/10b code conversions, and the number of conversions of converted data with respect to it is provided for RD+ conversions and RD− conversions. The "maximum RL" is a value determined by the conversion method, for example, 8b/10b code conversion, and is RL=5 in this case. In the present invention, a generating process is performed to generate the test pattern having the maximum RL in the code conversion method. The "maximum RL in one conversion unit" is the maximum number of a run length in which 0s or 1s are continuous in one piece of converted data, and RL=4 is the maximum in 8b/10b code conversion, which means that the maximum RL=5 of the number of continuous same values required for a test pattern cannot be ensured with one conversion unit. Therefore, upon code conversion of 8b/10b, a test pattern generating process of the present invention performs a process such that two conversion units of data, instead of data of one conversion unit, are combined so as to realize the maximum RL=5 at the boundary part thereof. With respect to each of the subsequent "maximum number of continuous same values in RD+ conversion a-side" and "maximum number of continuous same values in RD+ conversion j-side", a code list is generated, wherein, for example in 8b/10b code conversion, 8-bit data is converted into 10-bit data, and the front-side 6 bits and the back-side 4 bits of the converted 10-bit data serve as an a-side and a j-side, respectively. The maximum number of continuous same values in the part of a-side which is front-side 6 bits in the converted 10-bit data is stored as table information, and it is "3" in the case of 8b/10b code conversion. It is the same, 3, also in the j-side which is back-side 4 bits of RD+ conversion. The subsequent "maximum number of continuous same values in RD− conversion a-side" and "maximum number of continuous same values in RD+ conversion j-side" are similarly "3" in 8b/10b code conversion.

Figure 4B:
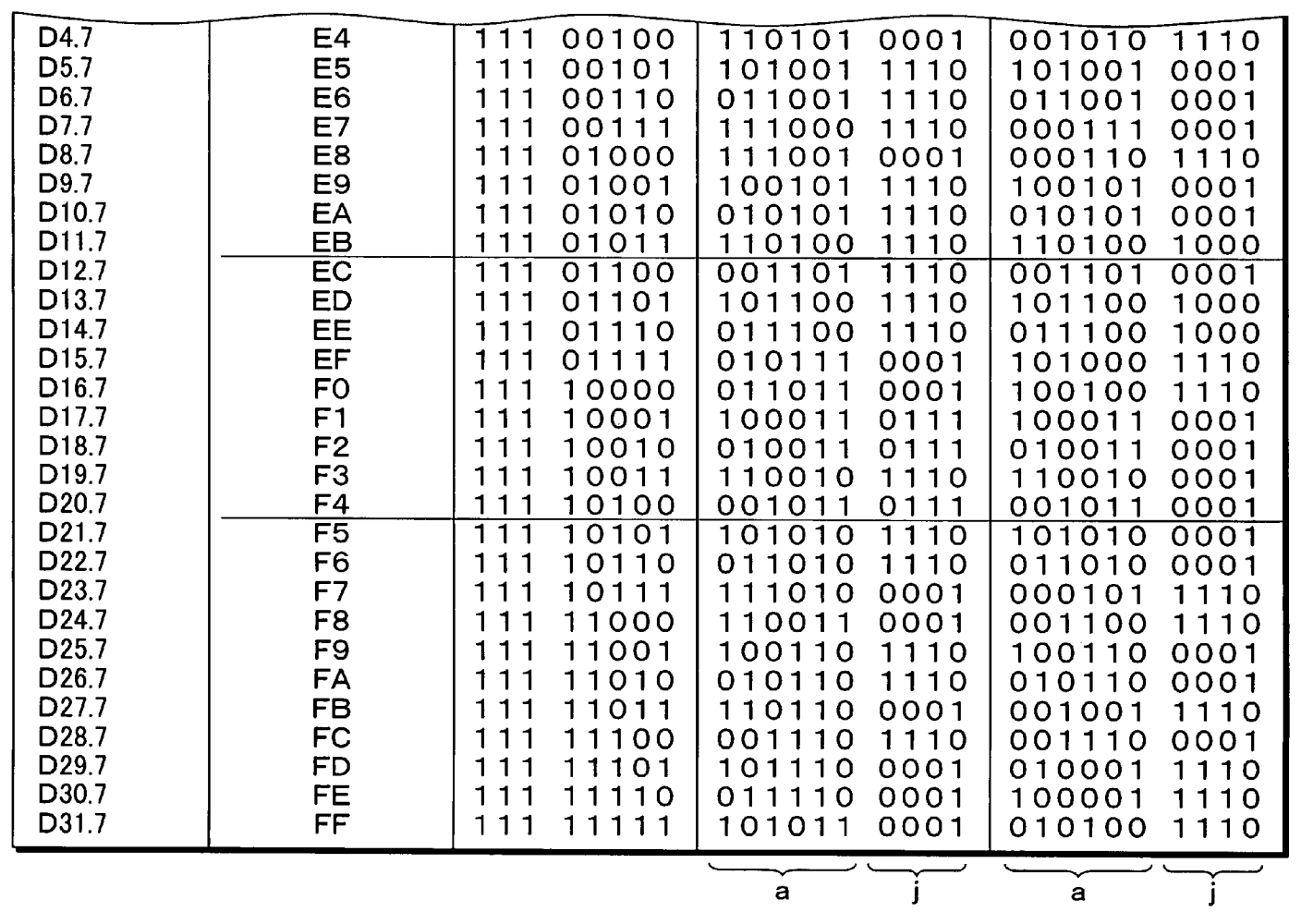

FIGS. 4A and 4B are explanatory diagrams showing a part of an 8b/10b code conversion table used in code conversion of the high-speed serial transfer device. In FIGS. 4A and 4B, the 8b/10b code conversion table 28 is comprised of code group names 30, octet values (hexadecimal number) 32, octet bits 34, RD− conversion data 36, and RD+ conversion data 38. Among these, the octet values 32 and the octet bits 34 are 8-bit input data, and the RD− conversion data 36 and the RD+ conversion data 38 is 10-bit converted data. As is clear from the 8b/10b code conversion table 28, with respect to one piece of 8-bit input data, two patterns, i.e., RD− conversion data and RD+ conversion data are provided. Therefore, with respect to 256 patterns of 8-bit input data, there are 256 patterns×2=512 patterns of the converted 10-bit data. Moreover, as shown in the lower side of the 8b/10b code conversion table 28, the RD− conversion data 36 and the RD+ conversion data 38 is divided into front-side 6 bits and back-side 4 bits, wherein the front-side 6 bits are an a-side, and the back-side 4 bits-are a j-side.

Figure 5:
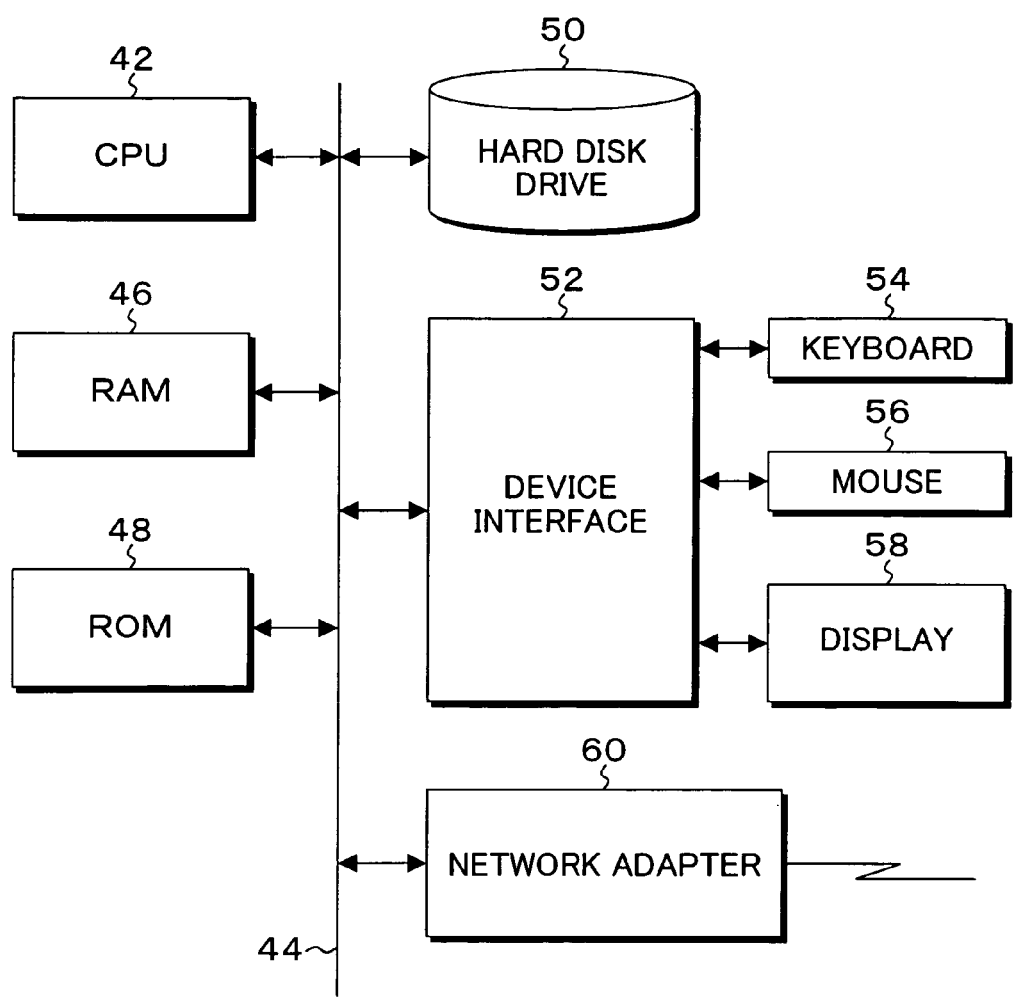
FIG. 5 is a block diagram of a hardware environment of a computer which realizes the functions of the test data generating device of FIG. 1.

FIG. 5 is a block diagram of a hardware environment of a computer which realizes the functions of the test data generating device of FIG. 1. In FIG. 5, to a bus 44 of a CPU 42 connected are a RAM 46; ROM 48; a hard disk drive 50; a device interface 52 connecting a keyboard 54, a mouse 56, and a display 58; and a network adapter 60. A program which executes the test pattern generating process of the present invention is installed in the hard disk drive 50, is read out from the hard disk drive 50 to the RAM 46 when the computer is started, and is executed by the CPU 42. Generation of the test pattern in the embodiment of the test data generating device of FIG. 1 will next be described in detail. In the receiving side of a high-speed serial transfer device, synchronization is achieved at the timing of bit change in received data which has undergone code conversion, so as to prevent mis-synchronization and garbled bits accompanying it (hereinafter, simply referred to as "mis-synchronization"). Therefore, as a test pattern for examining mis-synchronization failure, it is effective to successively transfer data which can obtain a bit sequence including same values of 0 or 1 bits continuing as much as possible as data after code conversion, i.e., data of continuous same values. Data of continuous same values serving as such test pattern can be obtained by calculating back from code conversion logic in the high-speed serial transfer device; however, the data of continuous same values cannot be obtained by simply transferring obtained data of continuous same values. This is for the reason that, even when the data of continuous same values is simply transferred, it cannot be transferred to corresponding channels in some cases in practice, since a high-speed serial transfer device usually has a plurality of serial transfer channels, and the method for distributing data to be transferred to the channels and the bit transferring order are different depending on the channel usage method and the transfer method of the target high-speed serial transfer device. Therefore, the data of continuous same values obtained by calculating back the code conversion logic has to be rearranged in accordance with the channel usage method and the like, so as to generate test data which is used for generating the test pattern which is to be successively transferred.

Figure 6A:
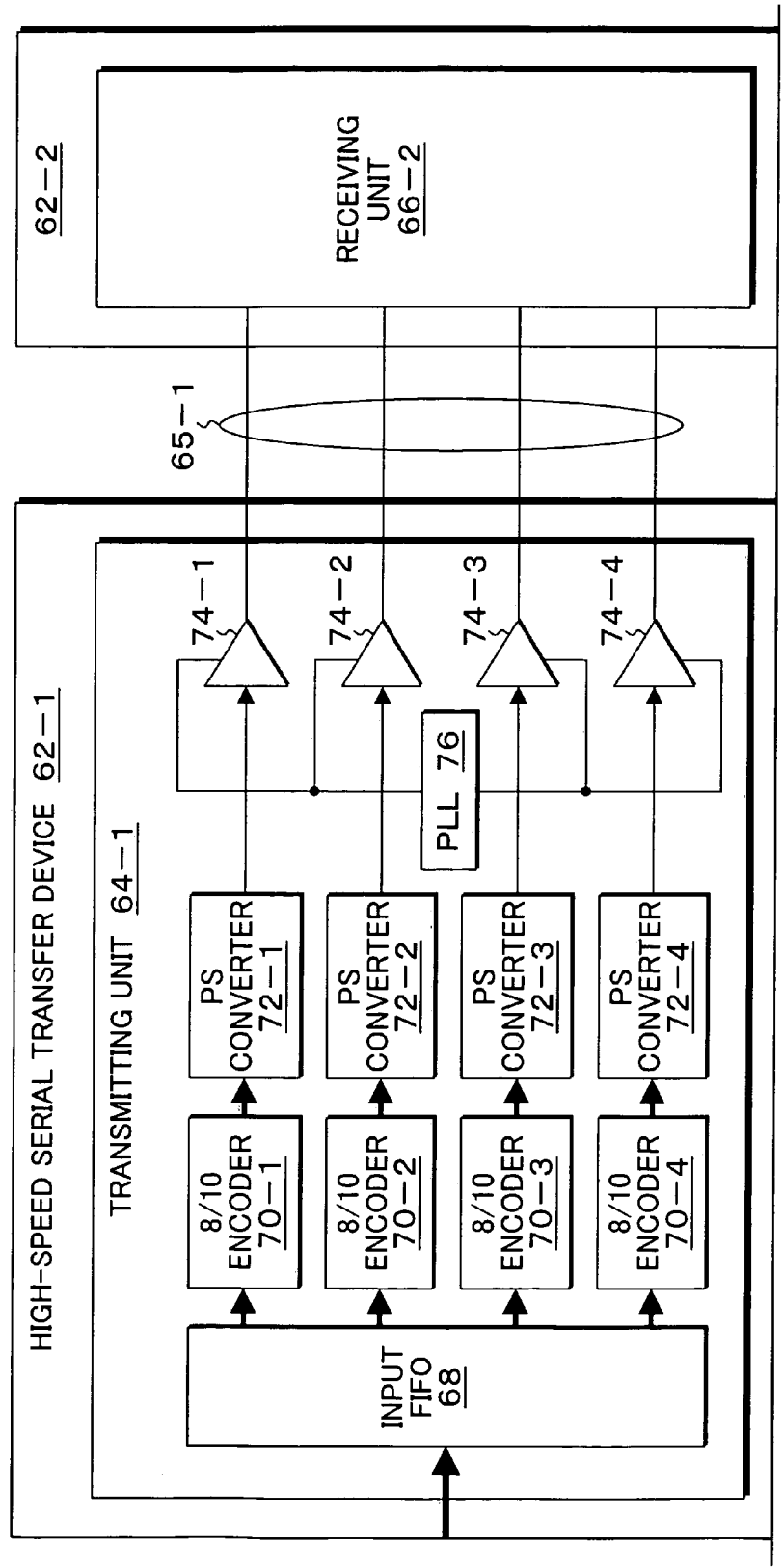
FIGS. 6A and 6B are block diagrams of high-speed serial transfer devices in which the test pattern of the present invention is used.
Figure 6B:
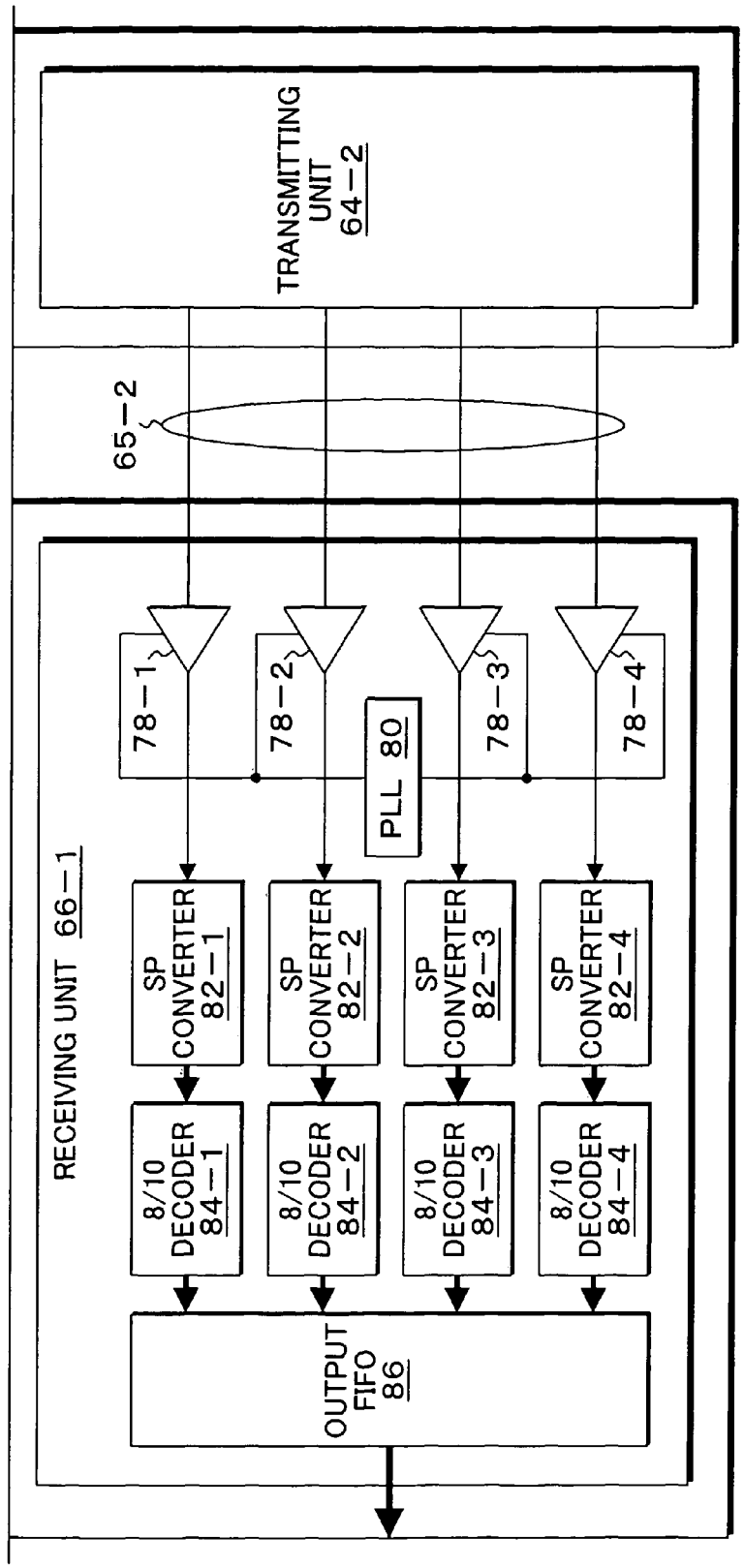

FIGS. 6A and 6B are block diagrams of high-speed serial transfer devices to which the test pattern of the present invention is applied. In FIGS. 6A and 6B, the high-speed serial transfer devices 62-1 and 62-2 are connected to each other, for example, by 4-channel serial transfer paths 65-1 and 65-2 so as to form 4-lane serial transfer paths. Each of the high-speed serial transfer devices 62-1 and 62-2 has a transmitting unit 64-1 and a receiving unit 66-1 as shown in the side of the high-speed serial transfer device 62-1. In the transferring unit 64-1, an input FIFO 68, 8/10 encoders 70-1 to 70-4, SP converters 72-1 to 72-4, drivers 74-1 to 74-4, and a PLL circuit 76 are provided. In the receiving unit 66-1, receivers 78-1 to 78-4, a PLL circuit 80, SP converters 82-1 to 82-4, 8/10 decoders 84-1 to 84-4, and an output FIFO 86 are provided.

Figure 7:
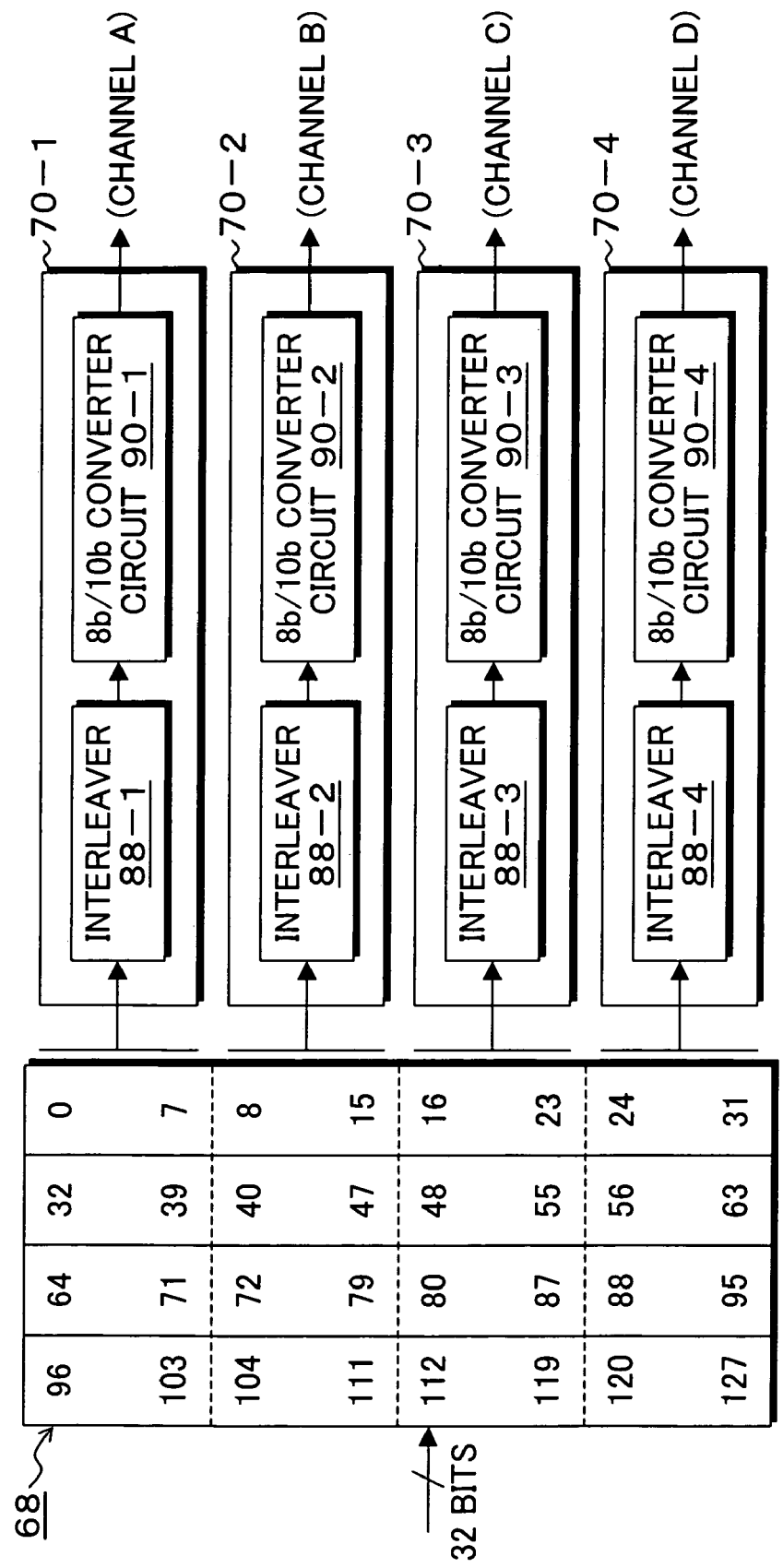
FIG. 7 is a block diagram of the input FIFO and the 8b/10b encoders of FIGS. 6A and 6B.

FIG. 7 shows the input FIFO 68 and the encoders 70-1 to 70-4 of FIGS. 6A and 6B. Data is input to the input FIFO 68 in, for example, 32-bit width, i.e., 4-byte width; and the data which is corresponding to the channels and divided into 8-bit units corresponding to the four channels is stored in the input FIFO 68. Herein, if the four channels are channels A, B, C, and D, bits 0 to 7, 32 to 39, . . . are given to the channel A; bits 8 to 15, 40 to 47, . . . are given to the channel B; bits 16 to 23, 48 to 55, . . . are given to the channel C; and bits 24 to 31, 56 to 63, . . . are given to the channel D. In the 8/10 encoders 70-1 to 70-4, interleavers 88-1 to 88-4 and 8b/10b code converter circuits 90-1 to 90-4 are provided. The interleavers 88-1 to 88-4 control the order of bit transfer such that, based on the method of bit transfer order of the high-speed serial transfer device 62-1, odd-numbered bits are sent first and even-numbered bits are sent subsequently in predetermined transfer units, or, inversely, even-numbered bits are sent first and odd-numbered bits are sent subsequently. Normal high-speed serial transfer devices employ a method of bit transfer order in which odd-numbered bits are sent first, and even-numbered bits are sent subsequently.

Figure 8:
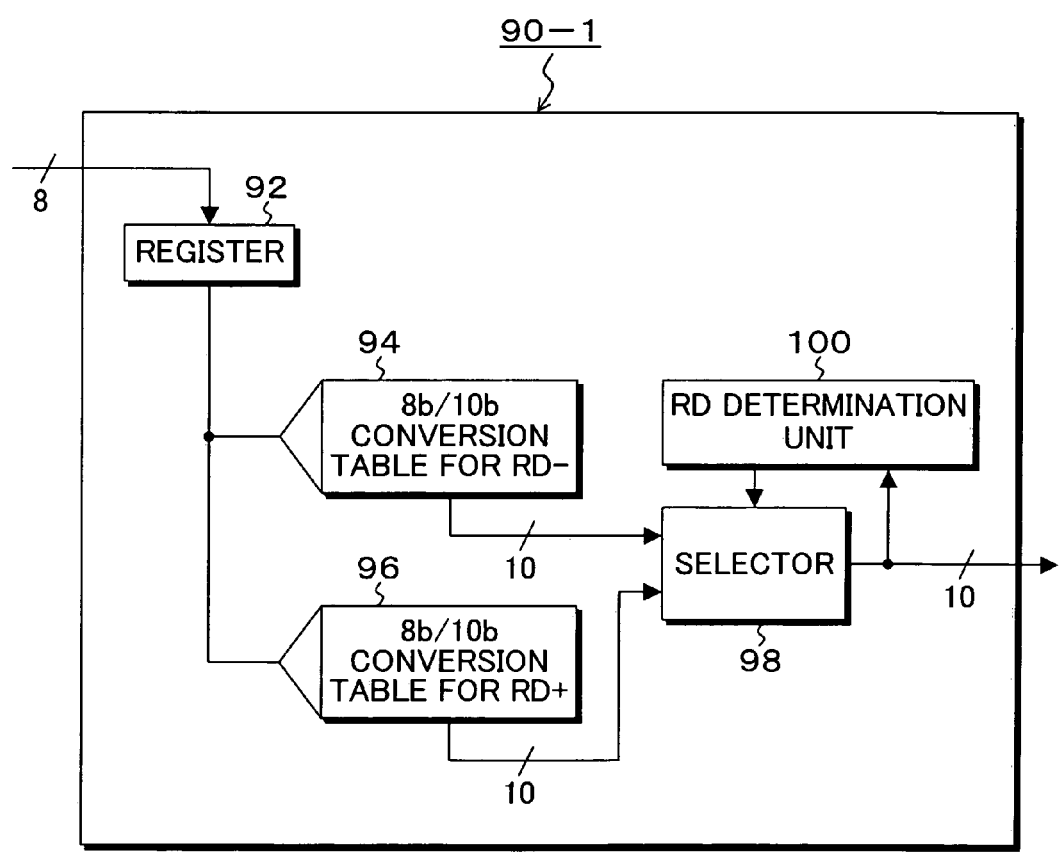
FIG. 8 is a circuit block diagram of the 8b/10b converter circuit of FIG. 7.

FIG. 8 is a circuit block diagram of the 8b/10b converter circuit 90-1 of FIG. 7. In FIG. 8, the 8b/10b converter circuit 90-1 has a register 92, an 8b/10b conversion table 94 for RD−, an 8b/10b conversion table 96 for RD+, a selector 98, and an RD determination switching unit 100. The register 92 retains 8-bit input data. The 8-bit data of the register 92 is input to the 8b/10b conversion table 94 for RD− and the 8b/10b conversion table 96 for RD+, converted into corresponding 10-bit data, and output to the selector 98. The selector 98 is subjected to selection control by the RD determination unit 100. The RD determination unit 100 determines whether the number of 0 and 1 bits is the same or different in previous converted 10-bit data, and, when it is different, performs RD switching for the subsequent conversion data. More specifically, if the previous code data has undergone, for example, RD− conversion, and the number of 0 and 1 bits of the converted data is the same, the subsequent conversion is the same RD− conversion. Meanwhile, if the values of 0 and 1 bits of the converted data proceeding to that are different, the subsequent conversion is determined to be switched conversion which is RD+ conversion. For example, when the high-speed serial transfer device 62-1 is taken as an example, a high-speed serial transfer device having such configuration of FIGS. 6A and 6B to FIG. 8 encodes and serialize data, which has been transferred from a previous stage, in the transferring unit 64-1, and transfer it to the high-speed serial transfer device 62-2 at a high speed through the 4-channel serial transfer path 65-1; and the received serial data is decoded in the receiving unit 66-2 so as to change it back to parallel data and transfer it to a subsequent stage. Mis-synchronization in this case is detected as a reception error in the receiving unit 66-2 of the high-speed serial transfer device 62-2 which is the destination of the transfer. Therefore, to generate a test pattern which readily generates a reception error in the receiving unit 66-2 is required in examination of mis-synchronization in the high-speed serial transfer device. In the present invention, such a data pattern specialized for generating mis-synchronization in the receiving side of the high-speed serial transfer device is generated as the test pattern. Since a reception error in the receiving unit is a cause of mis-synchronization, the pattern is arranged to readily induce mis-synchronization or the like in the received data in the receiving side, i.e., the data that passes through the serial part of the receiving side of the high-speed serial transfer device. A pattern which readily causes mis-synchronization of the high-speed serial transfer device is a pattern including a large run length (maximum number of continuous same values) and a little variation of bits between 0 to 1 and 1 to 0. The reason for that is due to the mechanism of mis-synchronization and the like in the high-speed serial transfer device. More specifically, as shown in FIGS. 6A and 6B, when the high-speed serial transfer device 62-1 is taken as an example, the PLL circuit 80 is incorporated in the receiving unit 66-1 thereof, and the PLL circuit 80 detects synchronization loss between the received data and a clock and feeds back the synchronization loss, thereby maintaining a synchronized state. This feedback performed by detecting the synchronization loss between the received data and the clock is performed at the timing of bit change of the received data. Therefore, as long as same values are continued in the received data, the feedback function of synchronization loss carried out by the PLL circuit 80 does not work. As a result, in a high-speed serial transfer device having low tolerance or a margin with respect to frequency deviation, when same values continue, synchronization between the received data and the clock is lost so that correct signal reproduction cannot be normally performed, and mis-synchronization or the like occurs. Generally, a plurality of channels is provided in a high-speed serial transfer device. Therefore, a focus of the test pattern generated in the present invention is how efficient a pattern having a large run length can be generated and transferred to each transfer channel so as to generate a state in which mis-synchronization readily occurs in a high-speed serial transfer device. In the present invention, the test pattern transmitted to the high-speed serial transfer device so as to include continuous same values is obtained by calculating back from the code conversion method. Herein, the back calculation of the code conversion method means to inversely determine actual data from encoded data, wherein, in the high-speed serial transfer device, the actual transfer data is encoded by code conversion by adding a certain number of bits thereto, and the encoded data is then serially transferred such that the encoded data is data of continuous same values. As described above, a process of selecting the basic pattern for a test from the code conversion table is performed with respect to unconverted data which is to be input to the high-speed serial transfer device such that a same value is continuous in the encoded data; and in this selection process, the following points have to be taken into consideration to determine the basic pattern.

(1) Consideration for byte order
(2) Consideration for running disparity
(3) Consideration for bit transfer order
(4) Consideration for the number of transfer channels The consideration for the byte order upon determination of the basic pattern will be described first. The basic pattern has significance in the order of the bit sequence thereof which is transferred through the serial part of the high-speed transfer device; therefore, the byte order method has to be taken into consideration. There are two byte order methods:

(1) little endian method (little Endian) employing a bit sequence in which a lower significant bit is at an end side, and
(2) big endian method (Big Endian) employing a bit sequence in which a higher significant bit is at the end side. In this consideration of the byte order method, the larger the number of continuous same values, the less possible to obtain a required number of continuous same values can be obtained with one unit of code conversion; and, when two units of code conversion are combined, the number of continuous same values can be obtained at the boundary thereof. For example, in 8b/10 code conversion, as shown in the code conversion control table 18 of FIG. 3, the maximum RL given according to the specification is RL=5, and this number 5 of continuous same values is obtained only by a combination of 2 bytes (8b×2).

FIG. 9 is an explanatory diagram separately showing, in accordance with the byte order methods, same-value continuous patterns each of which generated at the boundary part when two units of converted data in 8b/10b code conversion are combined. In a boundary same-value continuous pattern list 102 of FIG. 9, the byte orders are sorted into the little endian method and the big endian method so as to show bit sequence numbers of converted 10-bit data; and, at a data boundary 104 of the 10-bit converted data obtained through combination code conversion of unconverted two-byte data, a pattern which belongs to any of patterns 1 to 4 and having the number RL=5 of continuous same values is obtained.

Figure 10:
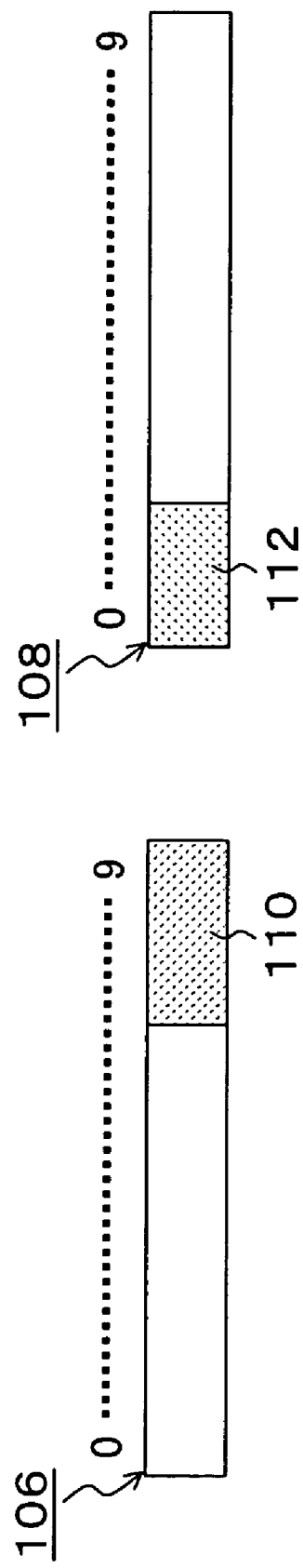
FIG. 10 is an explanatory diagram of a combination of two units of converted data employing the little endian method in which the lower significant bit is at the end side.

FIG. 10 is an explanatory diagram of a combination of two units of converted data employing the little endian method in which the lower significant bit is at the end side; wherein an same-value area 110 of converted data 106 is in the higher significant bit side, and, in converted data 108, an same-value area 112 is in the lower significant bit side inversely. In this case, the number of continuous same values of RL=5 can be obtained by the same-value areas 110 and 112 which are adjacent to each other at the boundary of the two pieces of converted data 106 and 108.

Figure 11A:
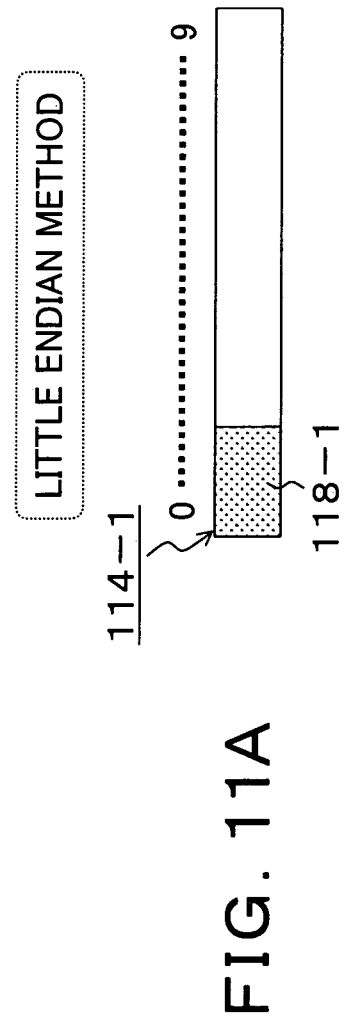
FIGS. 11A and 11B are explanatory diagrams of a case in which two units of converted data employing the little endian method are switched to the big endian method in which the higher significant bit is at the end side so as to achieve a number of continuous same values at the boundary part.
Figure 11B:
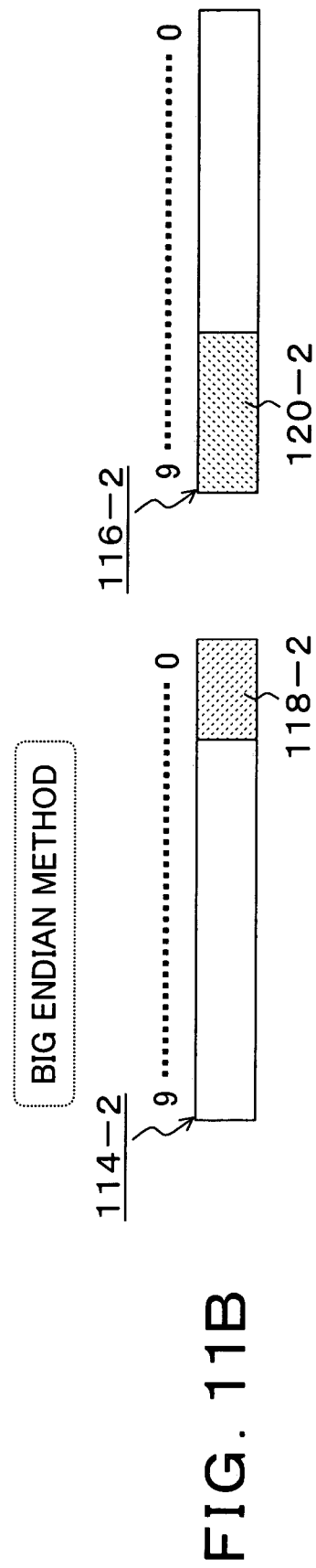

FIG. 11A shows a case in which converted data 114-1 and 116-1 employing the little endian method as well as FIG. 10 is combined; and, in this case, same-value areas 118-1 and 120-1 are sometimes present in the sides of the bits opposite to the boundary. In such a case, as shown in FIG. 11B, in the case of the big endian method, the same-value areas 118-2 and 120-2 are positioned on the both sides of the boundary with respect to the same converted data 114-2 and 116-2. Although the number of continuous same values, RL=5, has not been ensured in the little endian method, the number of continuous same values, RL=5, can be ensured at the boundary part in the big endian method. Therefore, when the test pattern of the present invention is to be determined, whether the byte order method employed by the high-speed serial transfer device is the little endian method or the big endian method has to be taken into consideration so as to determine unconverted data having the required number of continuous same values as the test pattern. The consideration for the running disparity (RD value) upon determination of the test pattern will next be described. The running disparity in the high-speed serial transfer device is a technique utilized for supporting amplification of a faint signal. In conversion techniques using code conversion tables of, for example, 3b/4b, 4b/5b, 5b/6b, and 8b/10b, one conversion unit is, for example, 8 bits if it is 8b/10b conversion, two different conversions of RD+ conversion and RD− conversion are provided with respect to this one conversion unit, and either one of the two conversions is used depending on the value of the running disparity. That is, the consideration for the running disparity means determining the basic pattern in consideration of switching between RD+ conversion and RD− conversion performed by the data per se flowing through the transfer channel. For example, when data X and data Y is cyclically transferred as unconverted data used in testing like "XYXY XY . . . ", the state of variation of the RD value will be any one of first to eighth cases.

In a two-unit cyclic pattern RD variation list 122 of FIG. 12, the state of variation of the RD value and corresponding conditions of the X and Y data are shown with respect to the first to eighth cases. As the "conditions of the X and Y data", "there is a difference in number" or "there is no difference in number" with respect to the number of 0 bits and 1 bits in 10-bit data after conversion of 8b/10b conversion of the data X and Y are serving as the conditions. In the description shown in the "state of variation of the RD value", for example, (X: RD+) means that the data X has undergone RD+ conversion. The variation of the RD values depending on difference in number of 0 and 1 bits in the converted data is according to the following rules.

(1) If there is no difference in number of 0 and 1 bits of the converted data, RD conversion is not switched.

(2) If there is a difference in number of 0 and 1 bits of the converted data, RD conversion is switched. For example, when the first case of FIG. 12 is taken as an example, it is the case in which, in the cyclic transfer data "XYXYXY XY . . . ", the number of 0 and 1 bits of the converted data of data X is different, while the number of 0 bits and 1 bits of the converted data of data Y is the same. In this case, since the number of 0 bits and 1 bits is different in the converted data (X:RD+) of the data X, switching of RD conversion is performed for the subsequent converted data of data Y, and the converted data thereof will be (Y:RD−). For the subsequent data X, switching of RD conversion is not performed since there is no difference in the number in the converted data of the previous data Y, and the converted data will be (X:RD−). Subsequently, switching of RD conversion is performed for the converted data of the subsequent data Y since there is a difference in number f the converted data of the data X, and the converted data will be (Y:RD+). Hereafter, this process is repeated. The second case is the case in which the previous converted data of the top data X of the first case is RD−, and the variation will be (X:RD−)(Y:RD+)(X:RD+)(Y:RD−). Herein, even when the data X and Y is the same data, whether it will be the first case or the second case is determined depending on if the RD value of the previous converted data thereof is that of RD− conversion or that of RD+ conversion. The third and fourth cases are the cases in which there is no difference in number of 0 and 1 bits of the converted data of the data X, and there is a difference in number of the converted data of the data Y. The fifth and sixth cases are the cases in which there are differences in number of 0 bits and 1 bits of the converted data of both the data X and Y. In these cases, switching of RD conversion is repeated for each data conversion. Furthermore, the seventh and eighth cases are the cases in which there is no difference in number of 0 and 1 bits of the converted data of both the data X and Y, wherein switching of RD conversion for the data X and Y is not performed, and the RD of the top converted data is continued. When the basic pattern is determined based on the consideration of byte order method and the consideration the running disparity described above, in this embodiment, XY=0xF4EB or XY=0xEBF4 can be determined as one pattern of data XY which is a combination of two units of unconverted data which can generate the maximum continuous number of RL=5 in encoded data in 8b/10b code conversion. Herein, "XY=0xF4EB" corresponds to the sixth case of FIG. 12, and "XY=0xEBF4" corresponds to the fifth case of FIG. 12. When the basic pattern is determined in the above described manner, rearrangement considering the bit order and the number of transfer pattern is further required for the test pattern which will be actually used. This is for the reason that the test pattern has to be generated in consideration of the point that a high-speed serial transfer device usually has a plurality of channels for data transfer, and the number of the channels and the order for transmitting bits are different depending on the installation locations and the design concept. Therefore, rearrangement of the basic pattern considering the transfer order will be described. The bit transfer order is taken into consideration for example when, for example as shown in FIG. 7 in the high-speed serial transfer device, the interleavers 88-1 to 88-4 are disposed at the previous stages of the 8b/10b code converter circuits 90-1 to 90-4, and bit transfer order control is performed for unconverted data having a predetermined transfer unit such that, for example, odd-numbered bits are transferred first, and even-numbered bits are subsequently transferred. In such a case, for example even when "0xF4EB" is determined as a testing pattern and code conversion is performed, converted data having an intended bit sequence order cannot be transferred. The data of continuous same values generated through code conversion performed by causing the test pattern to flow has its significance in the bit sequence thereof; therefore, the basic pattern is rearranged such that the bit transfer sequence having the basic pattern which achieves the desired number of continuous same values can be serially transferred. For example, when the big endian method is taken as an example as the byte order method, the bit sequence of the unconverted data of the basic pattern "0xF4EB" is "1111 0100 1110 1011"; and, if odd-numbered bits are caused to flow first and even-numbered bits are subsequently caused to flow as the byte transfer order method, and the basic pattern of this case is changed to "0xE9CF".

Figure 14:
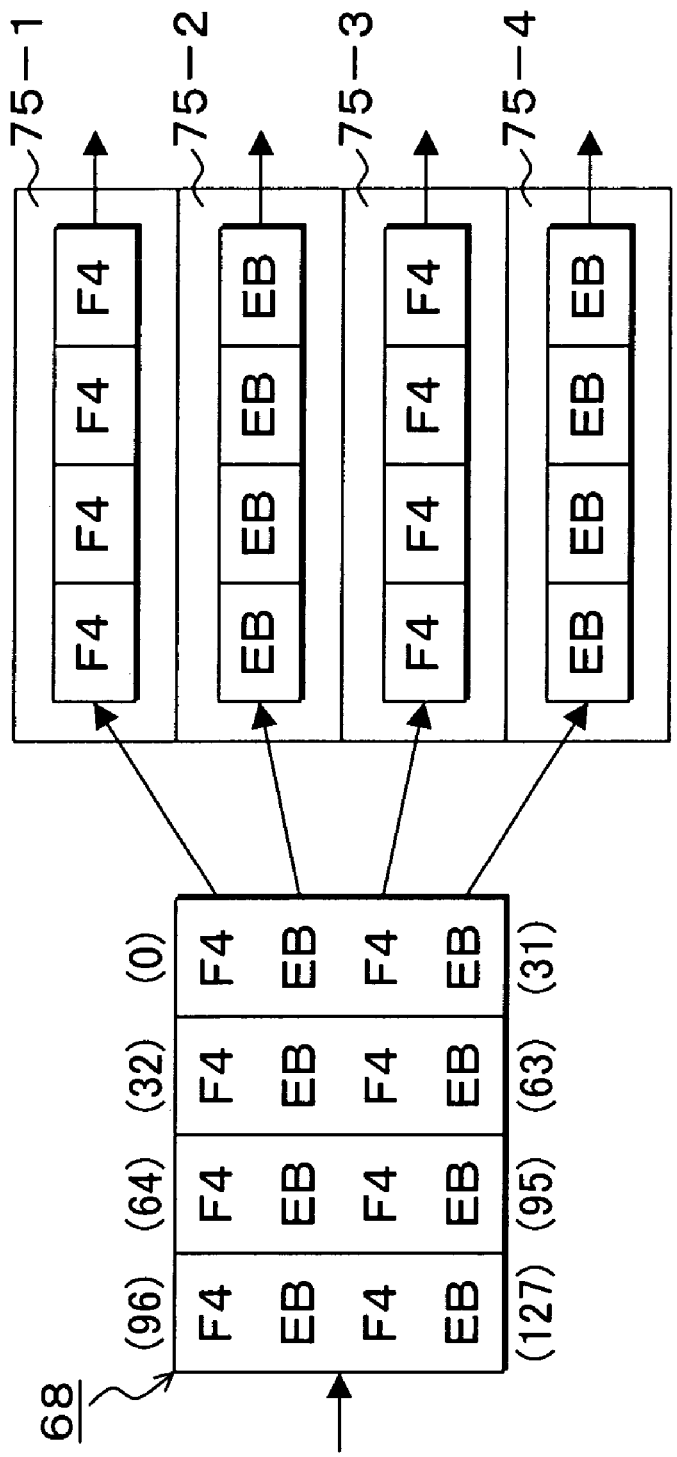
FIG. 14 is an explanatory diagram of a problem in a case in which the basic pattern 0xF4EB is successively transferred without considering the number of serial transfer channels.

FIG. 13 is an explanatory diagram of the test pattern "0xF4EB" after it is subjected to the bit transfer order control. Therefore, when the bit transfer order control in which odd-numbered bits are caused to flow first and even-numbered bits are subsequently caused to flow is performed, by virtue of the bit transfer order control, the original basic pattern "0xF4EB" can be obtained by causing the unconverted data of "0xE9CF" of FIG. 13 to flow as unconverted data; and it can be converted into converted data having the number of continuous same numbers RL=5 at the boundary part, and serially transferred. In FIG. 13, the odd-numbered bits and the even-numbered bits in the bit sequence of the basic pattern "F4EB" are separately arranged, wherein the odd-numbered bits constitute "0xE9" as 8-bit data, and the even-numbered bits constitute "0xCF". When the bit transfer order control is performed for such rearranged basic pattern "0xE9CF", and the odd-numbered bits are transferred first and the even-numbered bits are subsequently transferred, "0xF4" is obtained through transfer of the odd-numbered bits, and "0xEB" is obtained through transfer of the even-numbered bits. In other words, when the basic pattern "0xE9CF" which has undergone rearrangement as unconverted data is caused to flow through the bit transfer order control, the original basic pattern "F4EB" is obtained, and this can be subjected to 8b/10b code conversion. Lastly, the consideration of the number of transfer channels upon determination of the basic pattern will be described. FIG. 14 is an explanatory diagram of a problem in a case in which the basic pattern "0xF4EB" is successively transferred without considering the number of serial transfer channels. In FIG. 14, the input FIFO 68 has bit storage locations like that shown in FIG. 7 for input data. Therefore, when "0xF4EB" is successively input as input data without change, the storage state in the input FIFO 68 will be like that shown in the diagram. When this is allocated to serial transfer channels 75-1 to 75-4, "0xF4EB" which is the basic pattern cannot be caused to flow.

Figure 15:
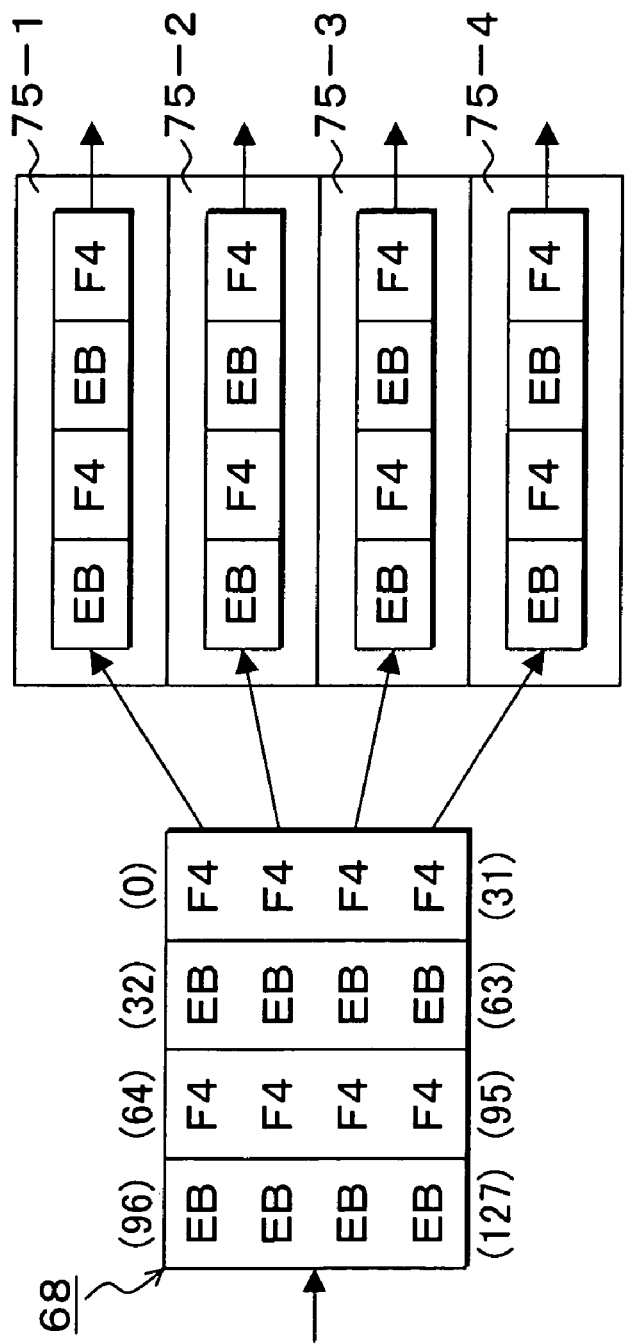
FIG. 15 is an explanatory diagram of a case in which the basic pattern 0xF4EB is rearranged in accordance with the number of serial transfer channels and successively transferred.

Thereat, as shown in FIG. 15, the number of the four channels of the transfer channels is taken into consideration, and the basic pattern "F4EB" is rearranged into "F4F4F4F4F4EBEBEBEB" and repeatedly written to the input FIFO 68. By virtue of such writing using rearrangement, the basic pattern "F4EB" can be successively caused to flow through the serial transfer channels 75-1 to 75-4 in parallel.

Figure 16:
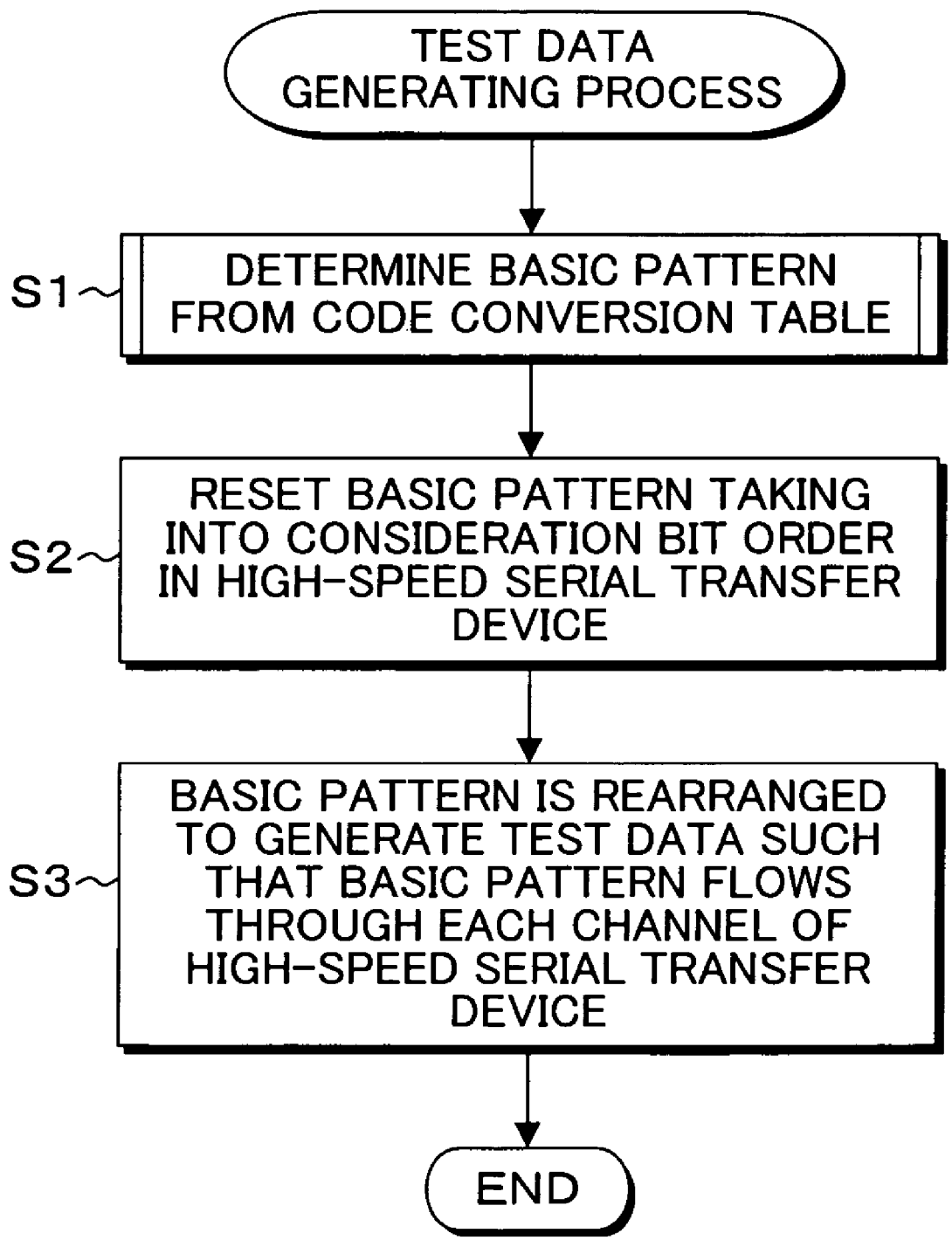
FIG. 16 is a flow chart showing a basic processing procedure of a test data generating process in the embodiment of FIG. 1.

FIG. 16 is a flow chart showing a basic processing procedure of a test data generating process in the embodiment of FIG. 1. In FIG. 16, in the test data generating process, a basic pattern is determined from a code conversion table in step S1. For example, in the case of 8b/10b code conversion, the basic pattern is determined from the code conversion table shown in FIGS. 4A and 4B. After the basic pattern is determined, the basic pattern is reset in step S2 in consideration of the bit order of the high-speed serial transfer device. Furthermore, in step S3, the basic pattern is rearranged in consideration of the bit transfer order and the number of transfer channels such that the basic pattern flows through each channel of the high-speed serial transfer device, thereby generating a final test pattern.

Figure 17:
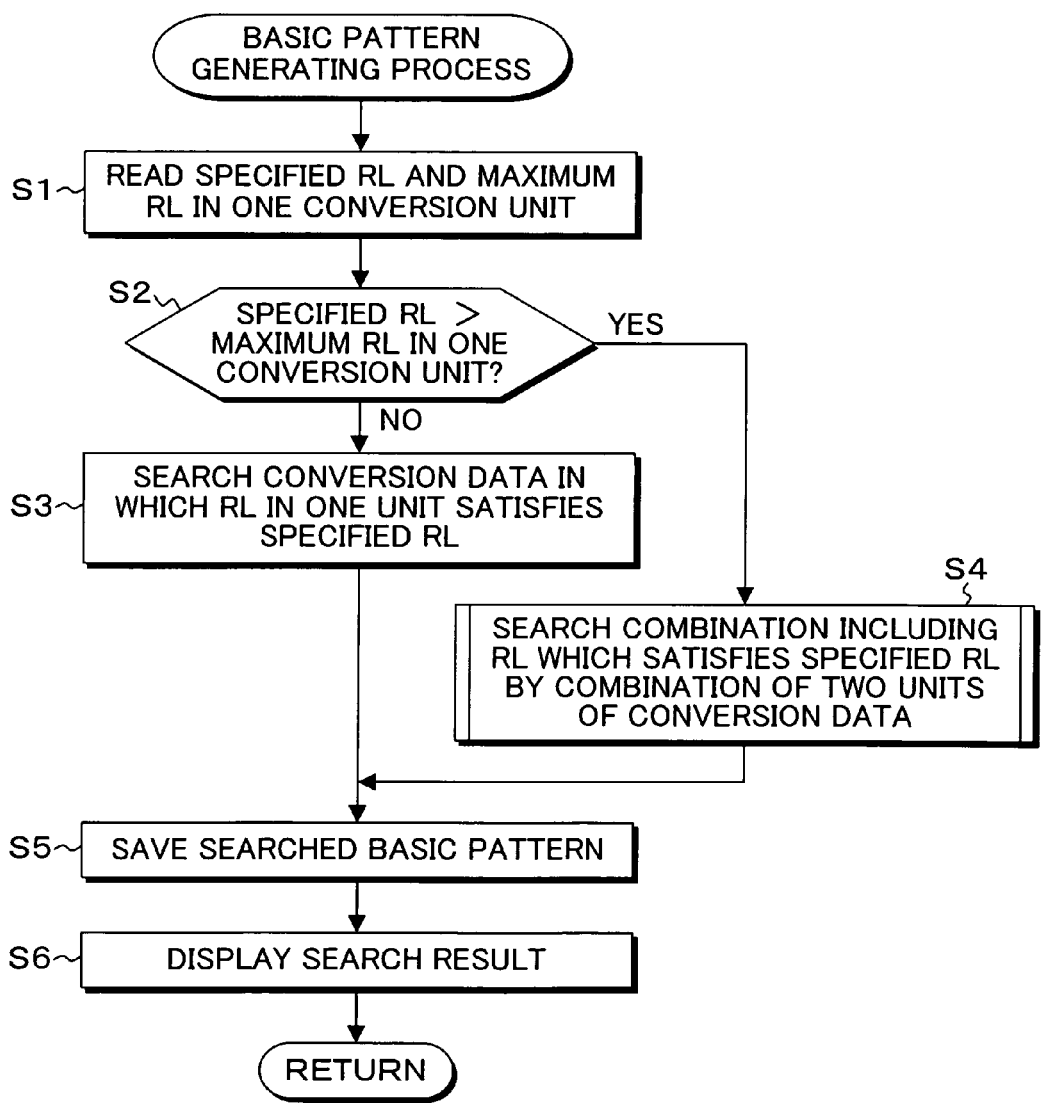
FIG. 17 is a flow chart of the basic pattern generating process of step S1 of FIG. 16.

FIG. 17 is a flow chart of the basic pattern generating process of step S1 of FIG. 16. Herein, the generating process of the basic pattern with respect to the 8b/10b code conversion table 28 of FIGS. 4A and 4B will be described as the following. First, in step S1, a specified run length which is a desired number of continuous same values required for generating the test pattern and a maximum RL in one conversion unit are read. As the specified run length, RL=5 which is the maximum RL upon use is specified as shown in the code conversion control table 18 of FIG. 3. The maximum RL in one conversion unit is found to be RL=4 at maximum according to the code control table 18 of FIG. 3. Then, in step S2, the specified RL and the maximum RL in one conversion unit are compared with each other. In this case, since the specified RL=5 and the maximum RL=4 in one conversion unit, the process proceeds to step S4 wherein a combination of two units of conversion data having a run length that satisfies the specified RL is searched. As a result of this search, in this embodiment, for example, "0xF4EB" can be searched as the basic pattern. On the other hand, if the maximum RL in one conversion unit is larger than the specified RL in step S2, the process proceeds to step S3 wherein the converted data having the run length RL, which is the number of continuous same values in one unit, satisfying the specified RL is searched, and the unconverted data thereof is retrieved. Subsequently, in step S5, the searched unconverted data comprised of one unit or a combination of two units is saved as the basic pattern. Then, in step S6, a plurality of the saved search results is displayed, and an operator selects one necessary basic pattern therefrom.

Figure 18:
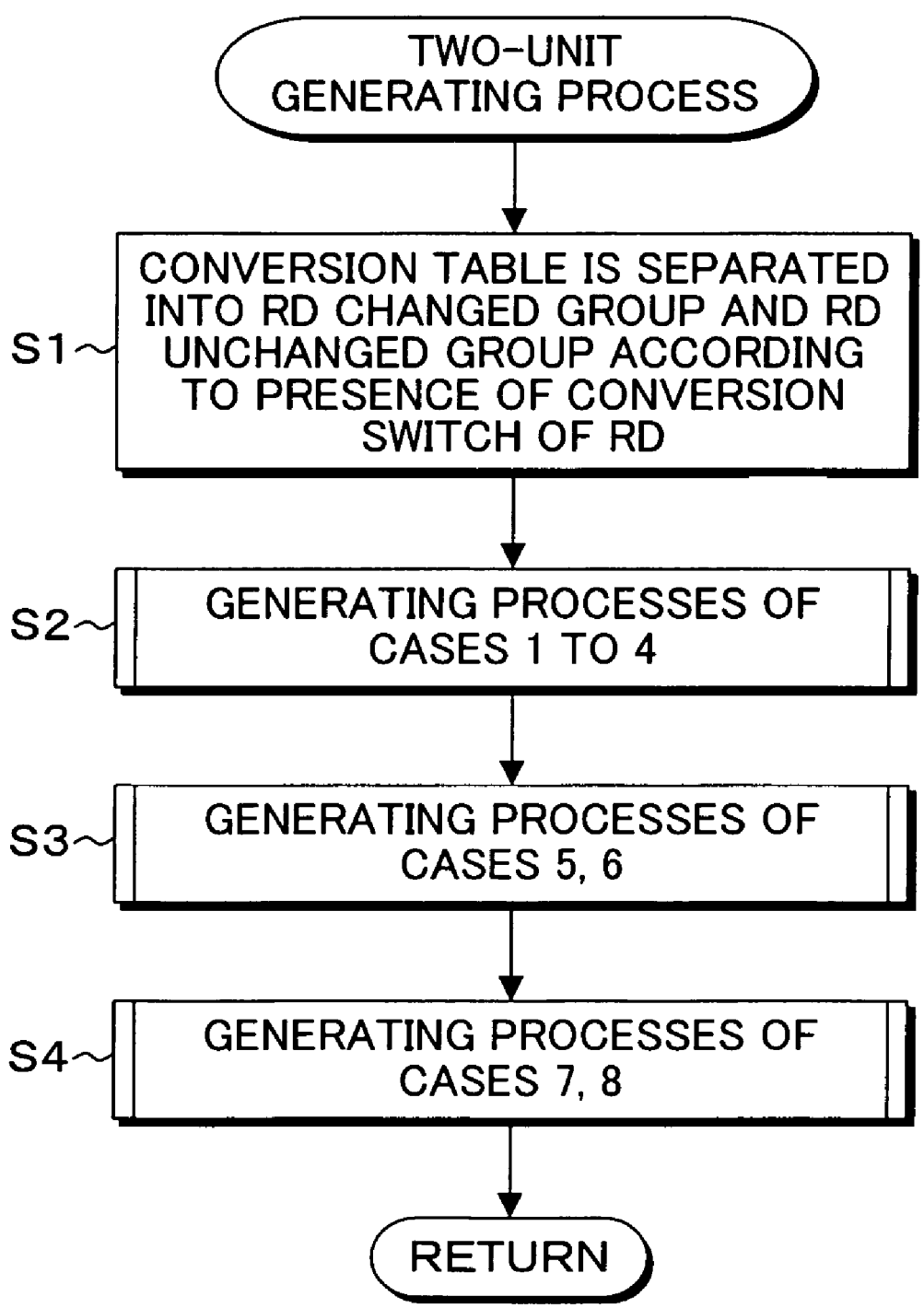
FIG. 18 is a flow chart of the two-unit generating process of step S4 of FIG. 17.

FIG. 18 is a flow chart of the process of step S4 of FIG. 17 for generating the test pattern by combining two units of conversion data. In FIG. 18, in generation of the test pattern using a combination of two units of conversion data, in step S1, for example, the 8b/10b code conversion table is separated into an RD changed group and an RD unchanged group in accordance with the presence of conversion switch of running disparity. More specifically, the number of 0 bits and 1 bits is obtained for 10 bit data which is converted data; and if the number is the same, it is separated to belong to the RD unchanged group, and if it is different, it is separated to belong to the RD changed group. Subsequently, instep S2, a process of searching and generating basic patterns corresponding to the first to fourth cases of FIG. 12 is executed. Subsequently, in step S3, a process of generating basic patterns by searching basic patterns corresponding to the fifth and sixth cases of FIG. 12 is executed. Furthermore, in step S4, a process of searching and generating basic patterns corresponding to seventh and eighth cases of FIG. 12 is executed.

Figure 19:
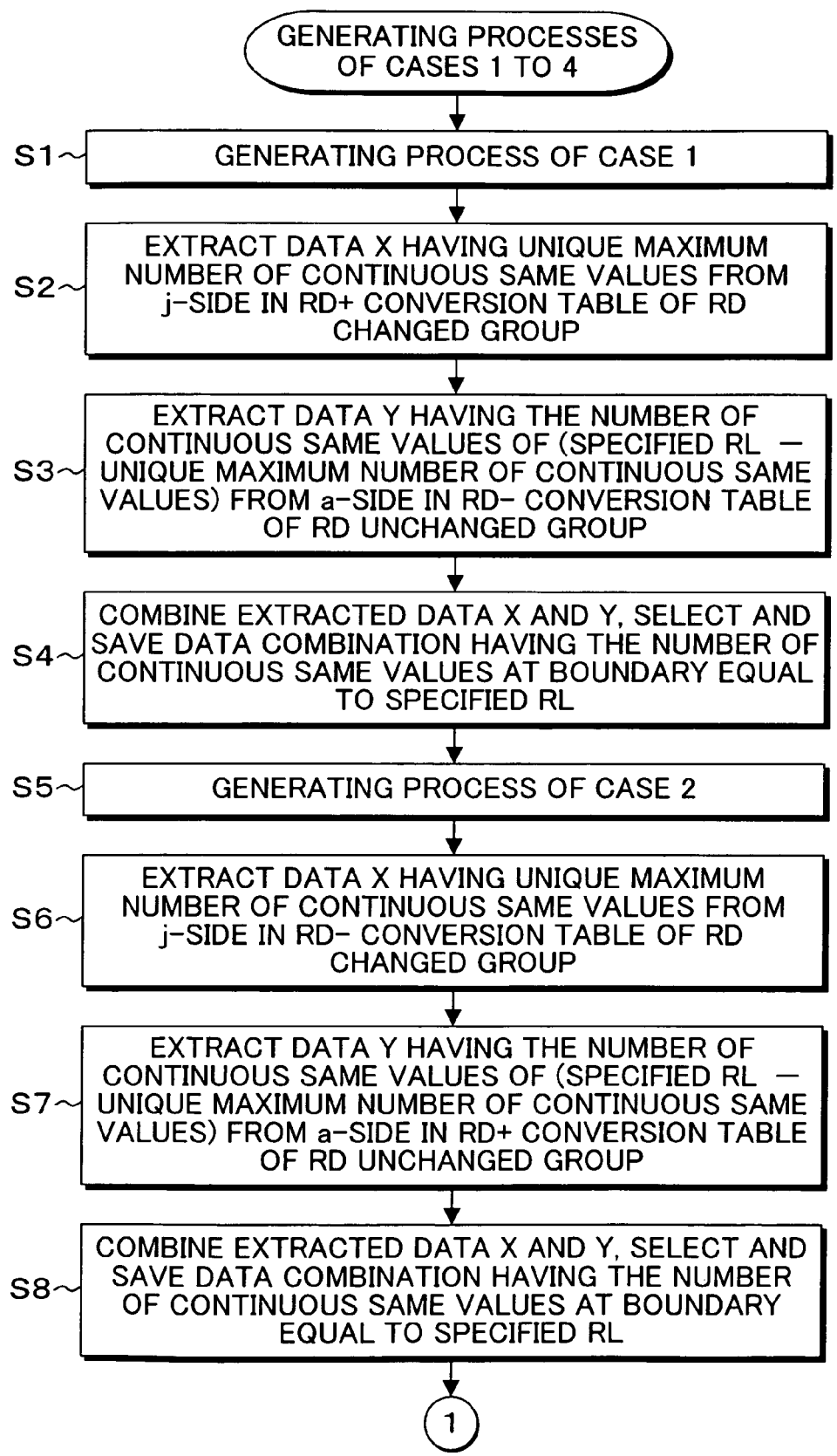
FIG. 19 is a flow chart of the generating processes of the first to fourth cases of step S2 of FIG. 18.
Figure 20:
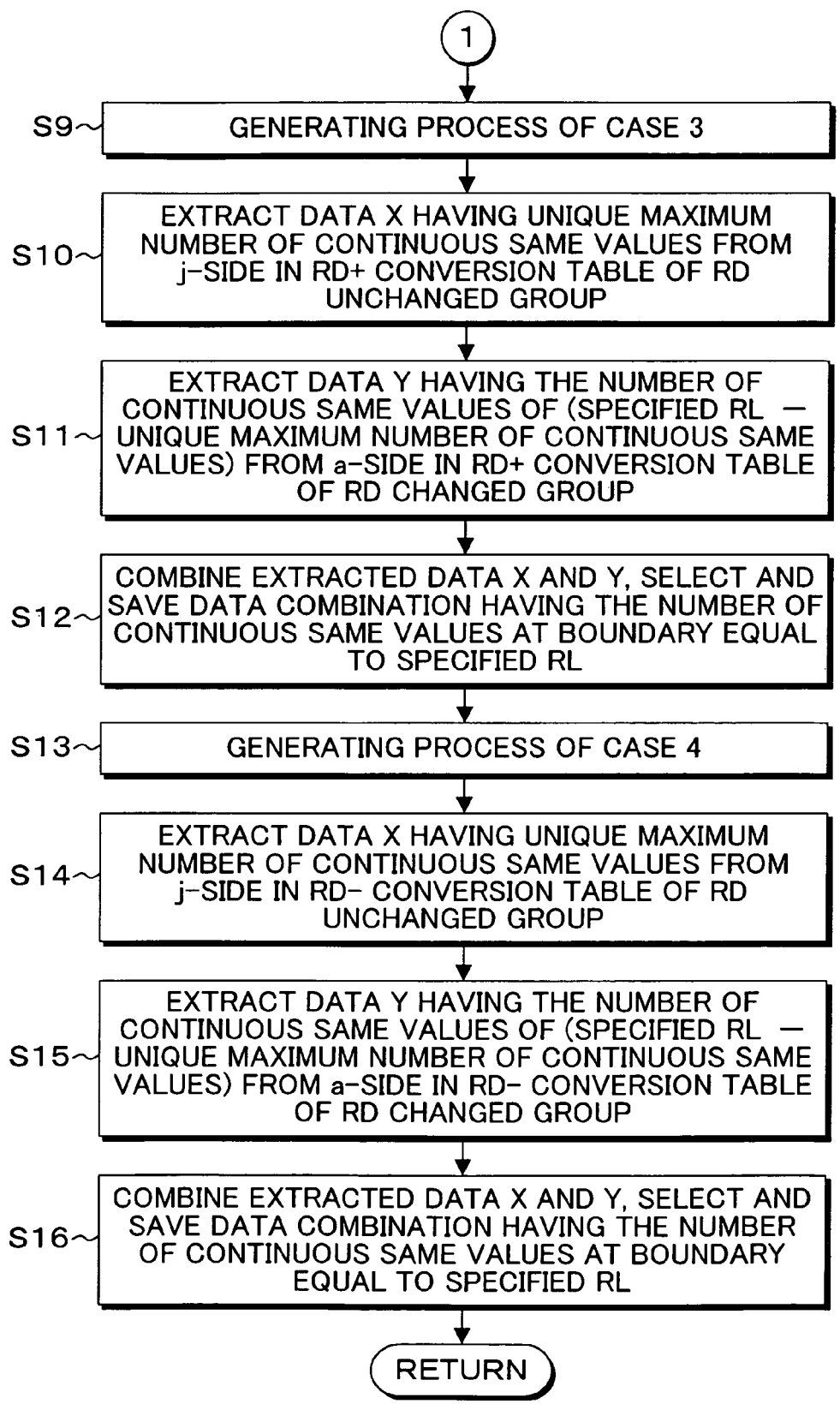
FIG. 20 is a flow chart of the generating processes subsequent to FIG. 19.

FIG. 19 and FIG. 20 are flow charts of the generating processes of the first to fourth cases of step S2 of FIG. 18. In FIG. 19, first, a generating process of the basic pattern of the first case is performed in steps S1 to S4. In the generating process of step S1 of the first case, in step S2, data X having a unique maximum number of continuous same values is extracted from the j-side which is four bits in the back side of 10 bits in the RD+ conversion table sorted to the RD changed group. The unique maximum number of continuous same values in the j-side is, in the case of 8b/10b: maximum number of continuous same values=3, according to the code conversion control table 18 of FIG. 3. Then, in step S3, similarly, from the a-side in the RD− conversion table in the RD changed group extracted is data Y having the number of continuous same values according to the following expression:

(specified RL—j-side unique maximum number of continuous-same values=5−3=2. Then, in step S4, the extracted data XY is combined, and a combination of data in which the number of continuous same values at the boundary is equal to the specified run length RL=5 is selected and saved. Steps S5 to S8 are the generating process of the basic pattern of the second case, wherein data X having the unique maximum number 3 of continuous same values is extracted from the j-side in the RD-conversion table of the RD changed group in step S6, data Y having the number 2 of continuous same values obtained by subtracting the maximum number 3 of continuous same values in the j-side from the specified RL is extracted from the a-side of the RD+ conversion table of the RD unchanged group in step S7, and the extracted data XY is combined and a combination of data in which the number of continuous same values at the boundary is equal to the specified run length RL=5 is selected and saved in step S8.

Steps S9 to S12 of FIG. 20 are the basic data generating process of the third case, wherein data X having the unique maximum number 3 of continuous same values is extracted from the j-side in the RD+ conversion table of the RD unchanged group in step S10, data Y having the number 2 of continuous same values obtained by subtracting the unique maximum number 3 of continuous same values in the j-side from the specified RL is extracted from the a-side of the RD+ conversion table of the RD changed group in step S11, and the extracted data XY is combined and a combination of data in which the number of continuous same values at the boundary is equal to the specified run length RL=5 is selected and saved in step S12. Furthermore, steps S13 to S16 of FIG. 20 are the generating process of the fourth case, wherein data X having the unique maximum number 3 of continuous same values is extracted from the j-side in the RD− conversion table of the RD unchanged group in step S14, data Y having the rest number 2 of continuous same values is extracted from the a-side of the RD− conversion table of the RD changed group in step S15, and the extracted data XY is combined and a combination of data in which the number of continuous same values at the boundary is equal to the specified run length RL=5 is selected and saved in step S16.

Figure 21:
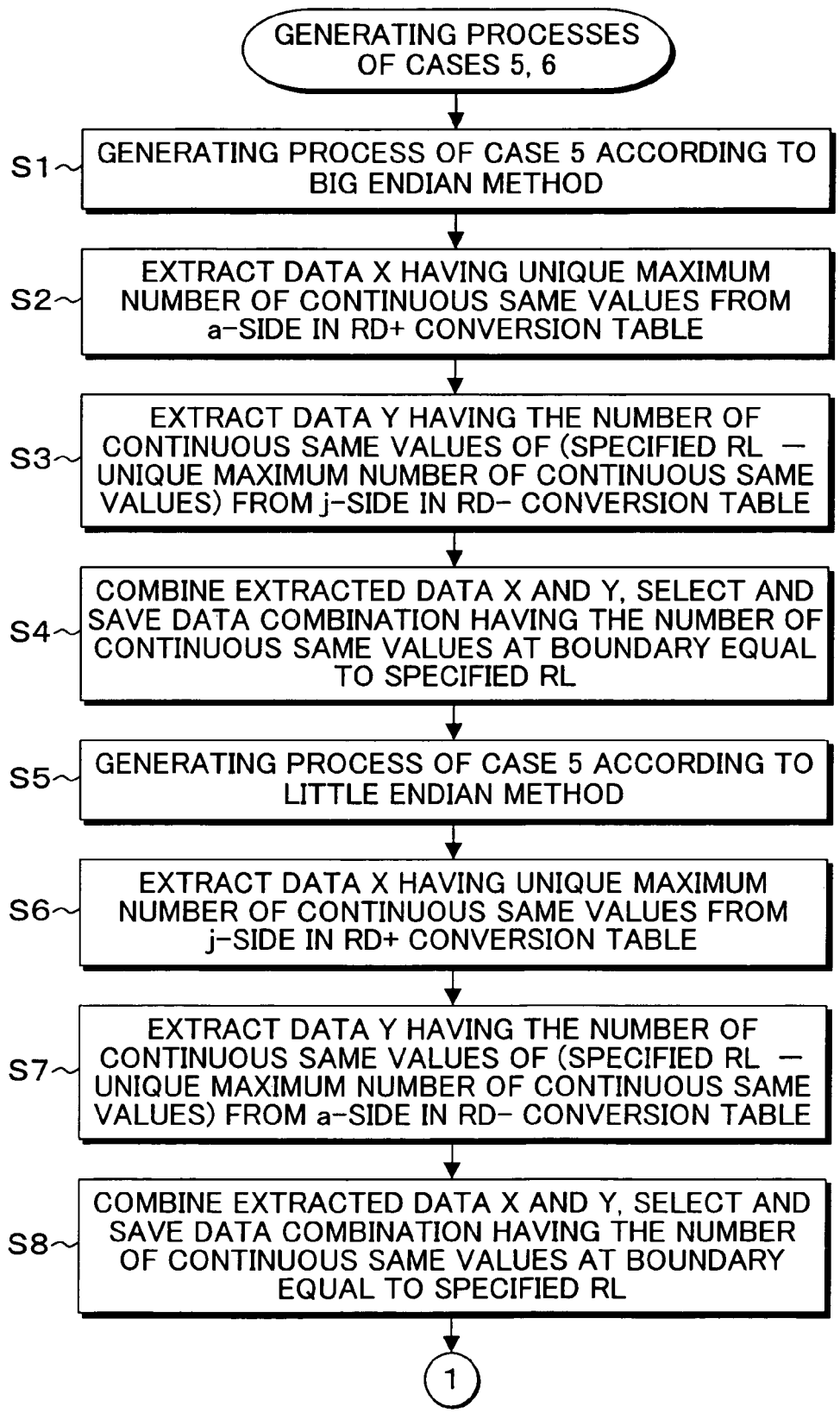
FIG. 21 is a flow chart of the generating processes of the fifth and sixth cases of step S3 of FIG. 18.
Figure 22:
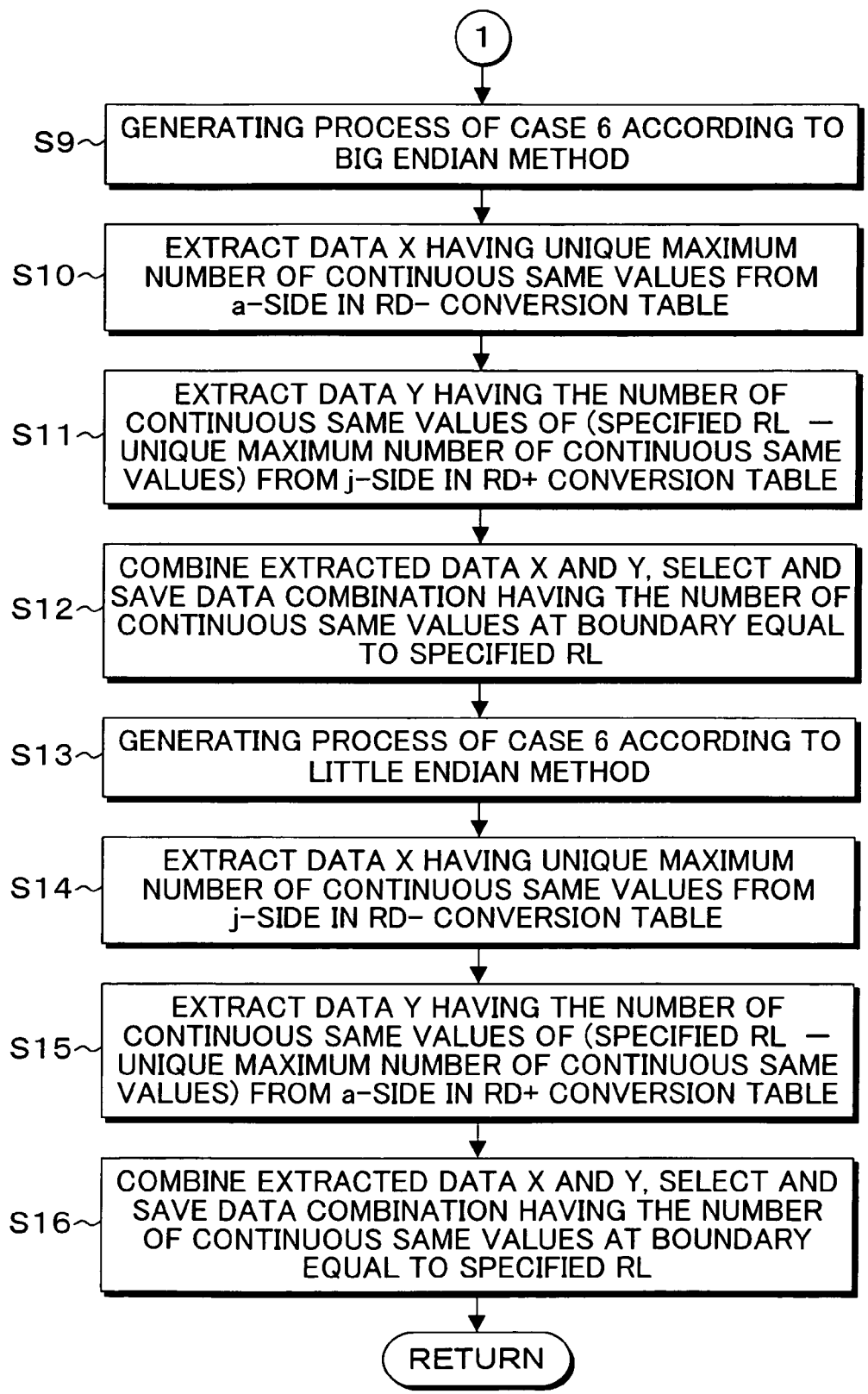
FIG. 22 is a flow chart of the generating processes subsequent to FIG. 21.

FIG. 21 and FIG. 22 are flow charts of the generating processes of the fifth and sixth cases of step S3 of FIG. 18. In FIG. 21, first, in steps S1 to S4, the generating process of the test pattern in the fifth case according to the big endian method is executed. Certainly, the generating processes of the fifth and sixth cases are performed for the RD changed group. First, in step S2, data X having the unique maximum number of continuous same values is extracted from the a-side in the RD+ conversion table. In the case of 8b/10b code conversion, the maximum number of continuous same values in the a-side is 3. Then, in step S3, from the j-side in the RD− conversion table extracted is data Y having the number of continuous same values obtained by subtracting the maximum number 3 of continuous same values in the a-side of step S2 from the specified run length RL, that is, in this case, the number of continuous same values according to the following expression: (specified RL)−(a-side maximum number of continuous same values)=5−3=2. Then, in step S4, the extracted data X, Y is combined, and a combination of data in which the number of continuous same values at the boundary is equal to the specified run length RL is selected and saved. Then, in steps S5 to S8, the generating process according to the little endian method is executed for the same fifth case. In the case of the little endian method, data X having the maximum number 3 of continuous same values is extracted from the j-side in the RD+ conversion table in step S6, data having the rest number 2 of continuous same values with respect to the specified run length RL is extracted from the a-side of the RD− conversion table in step S7, and the both data is combined and a combination of data in which the number of same continuous values at the boundary is equal to the specified run length RL=5 is selected and saved in step S8. Similar to the process of the fifth case, also for the sixth case, the generating process according to the big endian method is performed in steps S9 to S12, and the generating process according to the little endian method is executed in steps S13 to S16.

Figure 23:
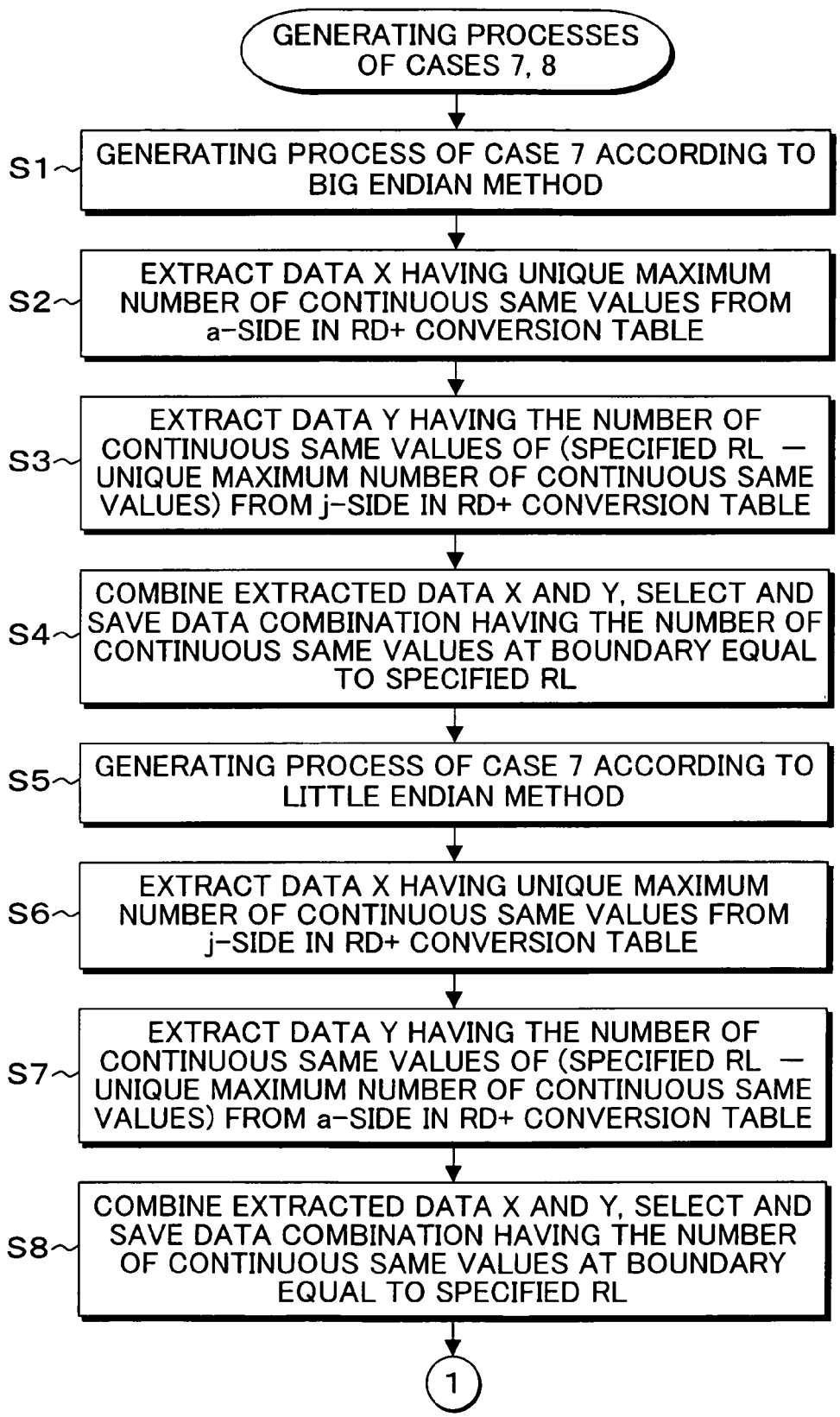
FIG. 23 is a flow chart of the generating processes of the seventh and eighth cases of step S4 of FIG. 18.
Figure 24:
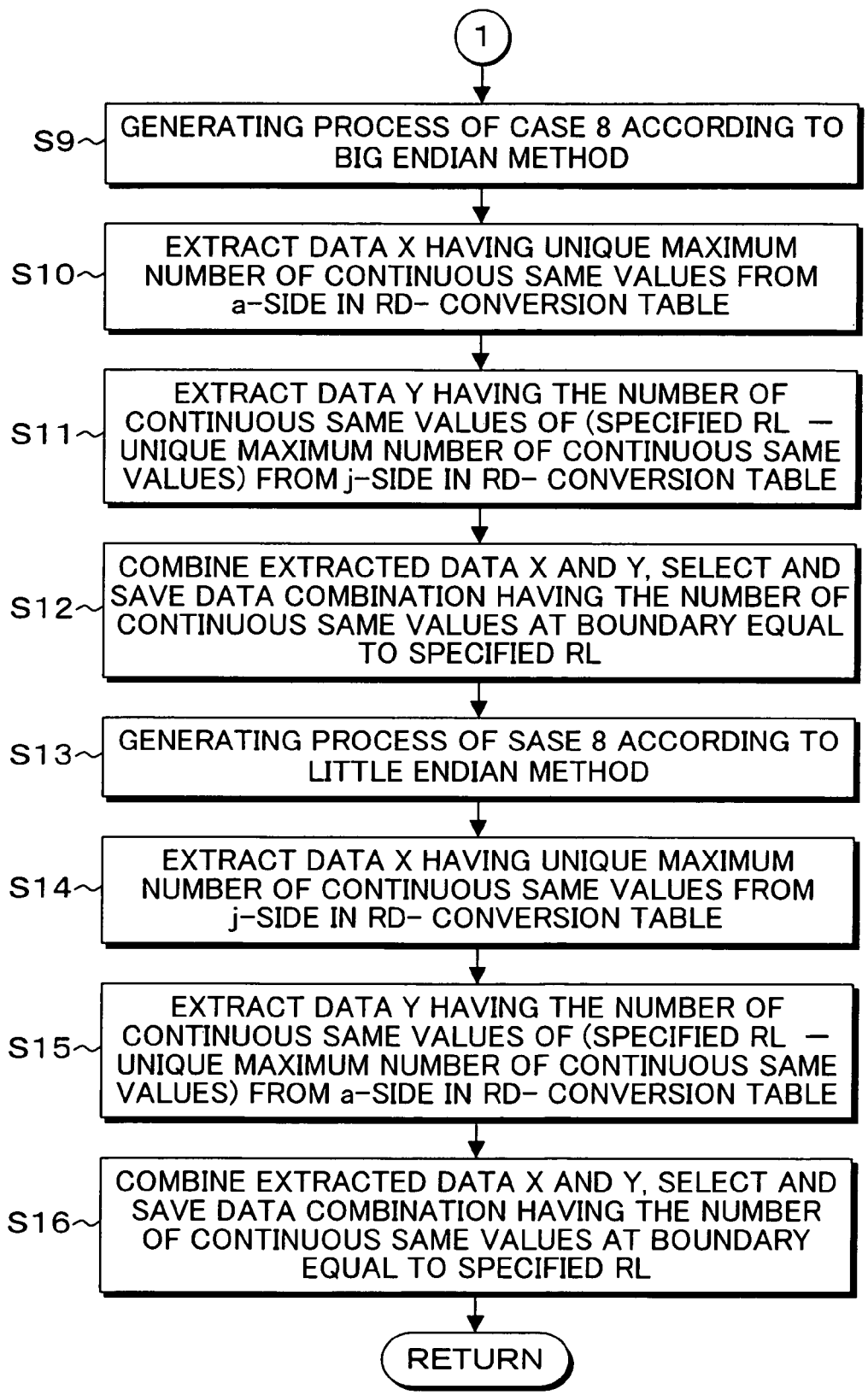
FIG. 24 is a flow chart of the generating processes subsequent to FIG. 23.

FIG. 23 and FIG. 24 are flow charts of the generating processes of the seventh and eighth cases of step S4 of FIG. 18. In the generating processes of the seventh and eighth cases, the generating processes are executed for the RD unchanged group. Steps S1 to S4 are the generating process according to the big endian method, wherein data X having the maximum number 3 of continuous same values is extracted from the a-side in the RD+ conversion table in step S2, and data Y having the rest number 2 of same continuous values with respect to the specified RL=5 is extracted from the j-side in the RD+ conversion table in step S3. Then, in step S4, the extracted data XY is combined, and a combination of the data in which the number of continuous same values at the boundary is equal to the specified RL=5 is selected and saved. Then, the generating process according to the little endian method of the seventh case is performed in steps S5 to S8. In the generating process according to the little endian method, data X having the maximum number 3 of continuous same values is extracted from the j-side in the RD+ conversion table in step S6, and data Y having the rest number 2 of continuous same values obtained by subtracting the number of continuous same values in the j-side from the specified RL is extracted from the a-side in the RD+ conversion table in step-S7.

Subsequently, steps S9 to S12 of FIG. 24 is the generating process of the eighth case according to the big endian method, and steps S13 to S16 are the generating process of the same eighth case according to the little endian method.

Figure 25:
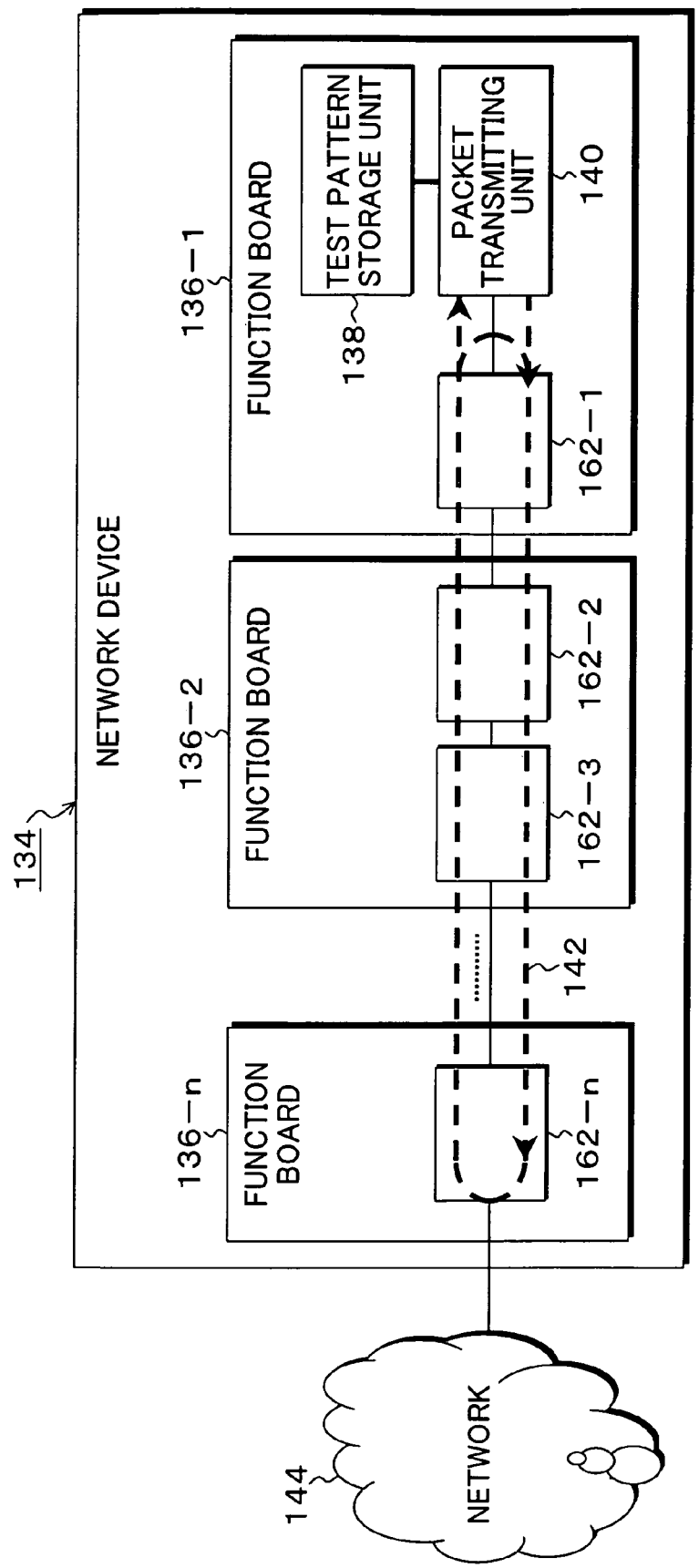
FIG. 25 is an explanatory diagram of a test method using the test pattern generated in the embodiment of FIG. 1.

FIG. 25 is an explanatory diagram of a test method for examining mis-synchronization according to the present invention using the test pattern generated in the embodiment of FIG. 1. In FIG. 25, a device to be tested is a network device 134 such as a router, in the network device 134 disposed are function boards 136-1 to 136-n for executing communication processing with a network 144, and high-speed serial transfer devices 62-1 to 62-n are used as interfaces connecting the function boards 136-1 to 136-n. More specifically, a packet transmitting unit 140 which is realized by a processor is provided in the function board 136-1, and communication is performed therefrom with the network 144 via the function boards 136-2 to 136-n. Since the test uses the test pattern of the present invention, a test pattern storage unit 138 is provided in the function board 136-1, and a test pattern generated according to the embodiment of FIG. 1 is stored. The test pattern from the test pattern storage unit 138 is successively caused to flow, as payload of a packet, through a test pattern transfer path 142 which goes around the high-speed serial transfer devices 62-1 to 62-n. Transfer is desired to be performed with throughput as high as possible since the transfer throughput of the test pattern in this case affects the detection effects of mis-synchronization failure. In addition, the longer the test pattern, the better; and the test pattern is transferred a plurality of times in an NTU unit wherein NTU is determined in network devices such as routers depending on the type of the network.

Figure 26:
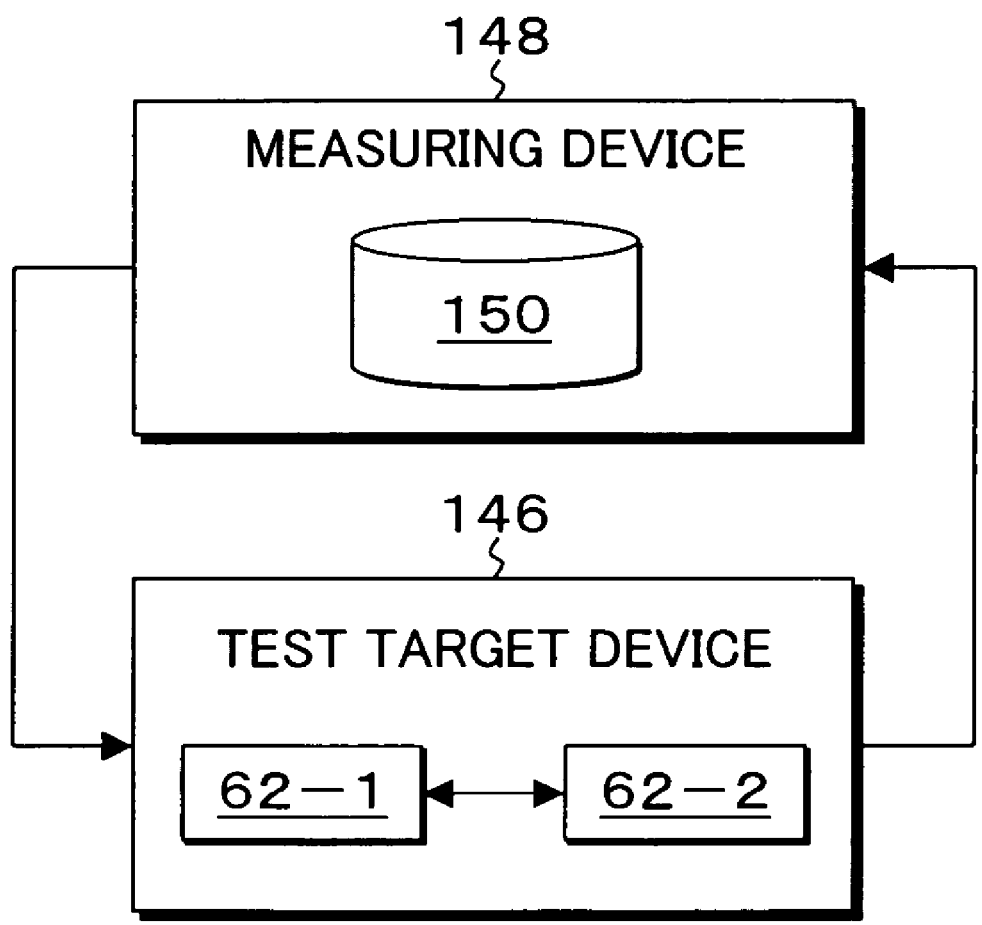
FIG. 26 is an explanatory diagram of another test method using the test pattern generated in the embodiment of FIG. 1.

FIG. 26 is an explanatory diagram of another test method using the test pattern generated in the embodiment of FIG. 1. In this test method, a test packet is generated from the test pattern stored in a test pattern storage unit 138 in an external measuring device 148 and transferred to a test target device 146, and the test pattern having repetitions of continuous same values based on the test packet is serially transferred between the high-speed serial transfer devices 62-1 and 62-2 provided in the test target device 146.

Figure 27:
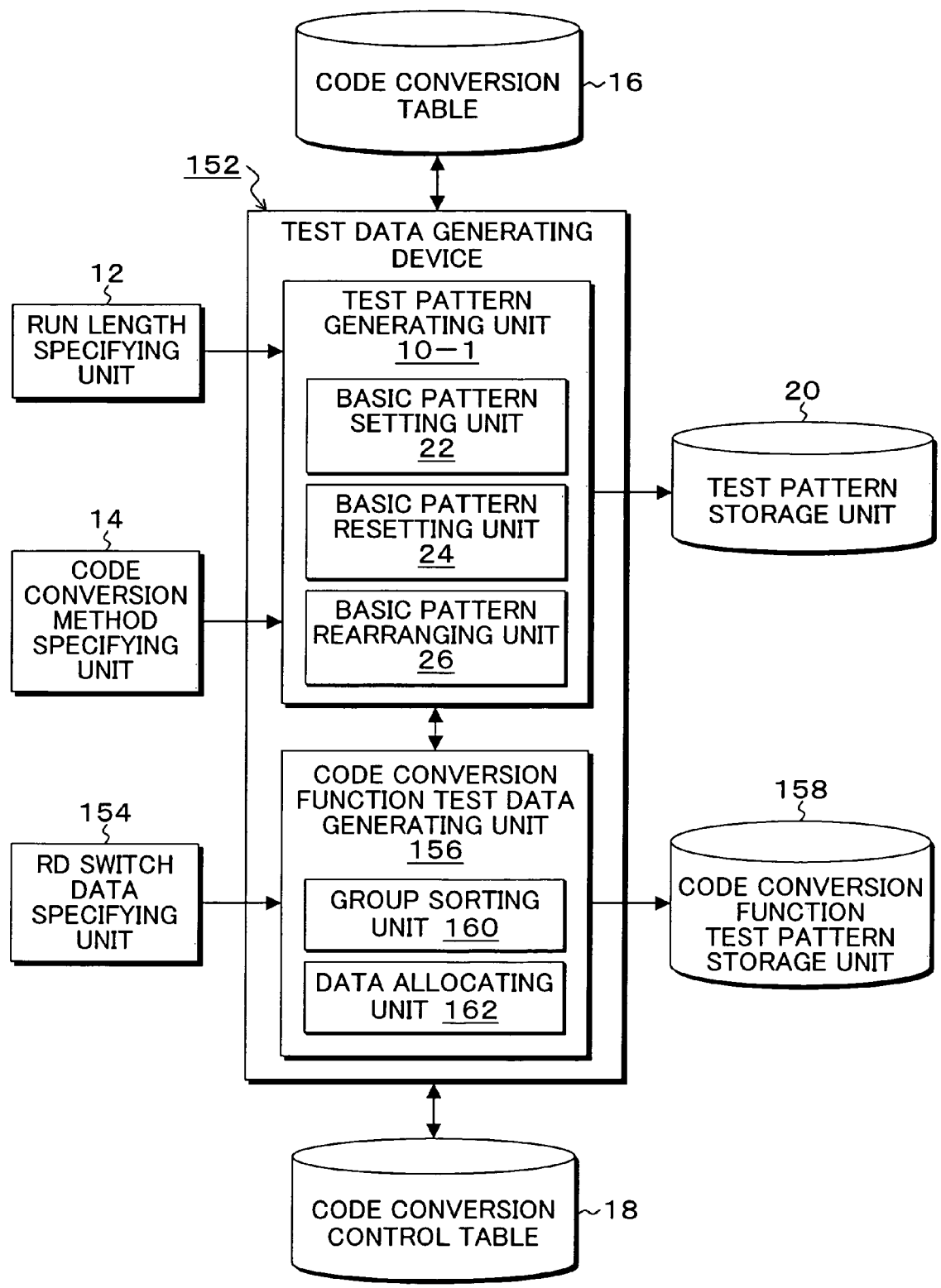
FIG. 27 is a block diagram of an embodiment of the present invention for generating a test pattern for performing all the RD conversions of the code conversion table.

FIG. 27 is a block diagram of another embodiment of the present invention for generating a test pattern for performing all code conversions of RD− conversions and RD+ conversions of the code conversion table provided in the high-speed serial transfer device. In FIG. 27, in a test data generating device 152, in addition to a test pattern generating unit 10-1 which is shown in FIG. 1 for generating a test pattern for examining failure such as mis-synchronization, a code conversion function test data generating unit 156 is newly provided, and an RD switch data specifying unit 154 and a code conversion function test pattern storage unit 158 are accordingly provided. Constituent functions other than these are the same as the embodiment of FIG. 1. The code conversion function test data generating unit 156 generates a test pattern in which unconverted data is arranged such that converted data of all code conversions of RD− conversions and RD+ conversions of the code conversion table is transferred to each of the plurality of serial transfer channels that the high-speed serial transfer device has. In the code conversion function test data generating unit 156, a group sorting unit 160 and a data allocating unit 162 are provided. The group sorting unit 160 sorts the code conversion table into an RD unchanged group and an RD changed group. The RD unchanged group is data in which the number of 0 and 1 bits of the converted data thereof is the same and which does not change the running disparity RD of the subsequent conversion data. The RD changed group is data in which the number of 0 and 1 bits of the converted data thereof is different and which changes the running disparity RD of the subsequent conversion data. The data allocating unit 162 forms a first group by disposing one unit of each unconverted data of the RD unchanged group in each line, then forms a second group by disposing two units of same data of each unconverted data of the RD unchanged group in each line, subsequently forms a third group by disposing merely one unit of predetermined unconverted data which belongs to the RD unchanged group in one line, and further forms a fourth group by disposing one unit of each unconverted data of the RD unchanged group in each line, thereby generating the test pattern. The code conversion function test pattern generated by the code conversion function test data generating unit 156 is subjected to test pattern rearrangement for rearranging the test pattern in the basic pattern rearranging unit 26 in accordance with the number of used channels in the high-speed serial transfer device such that data which has undergone all conversions is transferred to each channel, and is finally stored in the code conversion function test pattern storage unit 158. As an example, the embodiment of FIG. 27 employs a case in which it is combined with the embodiment of FIG. 1; however, it may be a dedicated device for generating the test pattern for performing all code conversions of RD− conversions and RD+ conversions of the code conversion table. This dedicated device is a device in which the constituents of FIG. 1 are eliminated from FIG. 27, however the basic pattern rearranging unit 26 remains. The need of the code conversion function test according to FIG. 27 is described as the following. In the high-speed serial transfer device, one conversion unit, for example, 8-bit data is subjected to RD− conversion or RD+ conversion in accordance with the RD value of the previous converted data, and the data after the conversion is serially transferred. Whether the RD− conversion or the RD+ conversion of the two patterns is to be used is determined by the RD value upon transfer of the data. The RD value is changed depending on difference in number of 0 and 1 bits of the data which has flown through the transfer channel. When the fact that various data normally flows therethrough before transferring the test pattern to the high-speed serial transfer device is taken into consideration, it is very hard to know precisely that it will be an RD+ conversion or an RD− conversion when the test data is caused to flow. Thereat, in the case of the above described test pattern for examining mis-synchronization, the test pattern which can obtain an intended run length value, for example, RL=5 is generated. In the case in which data of one conversion unit is transferred in the high-speed serial transfer device, if there is a difference in the umber of 0 and 1 bits, subsequent transfer data is subjected to a conversion opposite to the previous one, for example, when an RD+/− conversion is previously performed, the subsequent transfer data is subjected to an RD−/+ conversion, and if there is no difference in the number, the same conversion is performed, for example, when an RD+/− conversion is previously performed, an RD+/− conversion is performed for the subsequent transfer data. Thereat, when data having a difference in the number of 0 and 1 bits in the data thereof after code conversion is added to a basic pattern, the RD value thereof can be forcibly changed by the added data. For example, when combined data of data X and Y is cyclically transferred like "XYXY XY . . . ", variation of the RD value will be as shown in FIG. 28.

FIG. 28 shows the state of variation of the RD value separately in the first to eighth cases, which is same as FIG. 12. In addition, FIG. 28 shows problems in relation to occurrence of RL=5 which provides the maximum number of same continuous values in the first to eighth cases. In the first to fourth cases of FIG. 28, for example, in 8b/10b code conversions, when RL=5 can be obtained at the boundary of data X and Y, and when the data XY is cyclically transferred, one RL=5 can be always obtained in 4 bytes regardless of the performed conversion, i.e., an RD− conversion or an RD+ conversion. However, in the fifth to eighth cases, no RL=5 is obtained under the conditions shown in the diagram. Thereat, the problem that RL=5 does not occur is solved by adding data Z which forcibly changes the RL value after a code conversion in the fifth to eighth cases, and providing data XYZ.

FIG. 29 shows the state of-variation of the RD value in cyclic transfer of a case in which the data Z which forcibly changes the RL value is added in the fifth to eighth cases of FIG. 28. In this cases, as the data XYZ, for example,
X=0xF4,
Y=0xEB, and
Z=0xFC
is used.

Such idea of adding data which forcibly changes the RD value can be applied to the process which is performed by the code conversion function test data generating unit 156 of FIG. 27 for generating the test pattern for executing all table conversions of RD+ conversions and RD− conversions in the code conversion table.

For example, as is clear from the 8b/10b code conversion table 28 shown in FIGS. 4A and 4B, with respect to 256 patterns of input 8-bit data, two patterns, i.e., RD+ conversion and RD− conversion are provided for the conversion data; therefore, there are 256×2=512 patterns of conversions, and the test pattern which enables successive execution of all of the 512 patterns of the conversions has to be generated. Herein, the 8b/10b code conversion table can be sorted into the following two.

(1) RD unchanged group in which the number of 0 and 1 bits is the same and the RD value is not changed in 10b converted data (2) RD changed group in which the number of 0 and 1 bits is different and the RD value is changed in 10b converted data (123 variations)

Figure 30:
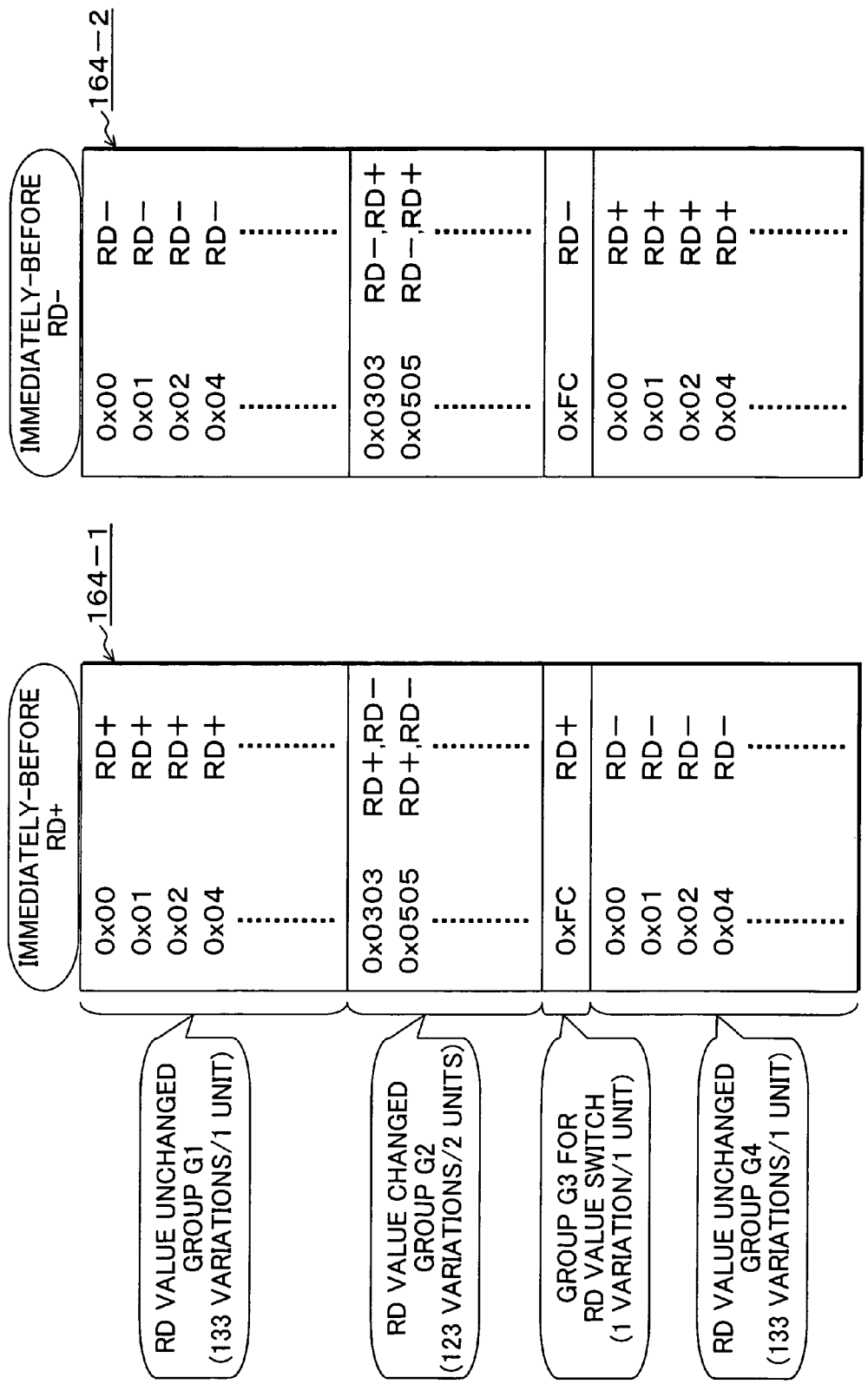
FIG. 30 is an explanatory diagram of a sorted 8b/10b code conversion table for generating the test pattern for performing all the RD conversions without depending on the RD value immediately preceding the transfer.

Thereat, in order to generate the test pattern for realizing all conversions of the code conversion table, the data of the RD unchanged group including 133 variations and the RD value changed group including the 123 variations is arranged in the manner of FIG. 30. The arrangement according to the table sorting of FIG. 30 is according to the following procedure.

(1) Units of 133 variations which belong to the RD value unchanged group are arranged one by one, thereby forming a group G1.

(2) Units of the 123 variations which belong to the RD value changed group are arranged two by two, thereby forming a group G2.

(3) One piece of data which belongs to the RD changed group is selected and arranged for RD value switching, thereby forming a group G3.

(4) Units of the 133 variations which belong to the RD value unchanged group are arranged one by one, thereby forming a group G4.

The table sorting of FIG. 30 according to this procedure is described in detail as the following. FIG. 30 separately shows a sorted conversion table 164-1 of the case in which RD+ comes immediately before and a sorted conversion table 164-2 in which RD− comes immediately before, wherein the two tables are shown in a row. For example, in the sorted conversion table 164-1, according to above described (1) to (4) units of the 133 variations of the RD unchanged group are arranged one by one as the group G1, and, in this case, since the previous RD value is RD+, all of the RD values of the group G1 are RD+. Subsequently, in the group G2, from the RD changed group, two units of the same 8-bit data are disposed in rows. For example, "0x0303" is disposed with respect to 8-bit data "0x03", and two pieces of data "RD+ conversion data" and "RD− conversion data" are disposed as the converted data thereof. In the subsequent group G3, one piece of the data in the group G2, for example, "0xFC" is disposed. This "0xFC" has an RD switching function; and, since RD1 values of the last converted data of the group G2 is "RD−", "RD=" is allocated as the group G3, and, as the subsequent group G4, the remaining "RD−" conversions of the same unconverted data as the group G1 with respect to the already converted "RD+" are allocated. The sorted conversion table 164-2 is in the case in which the previous RD value is "RD−"; and, in this case, the group G4 in the sorted conversion table 164-1 serves as the group G1, and the group G1 is switched with the group G4. Moreover, the RD value in "OXFC" of the group G3 for switching the RD value is arranged to be "RD−" since the last of the group G2 is "RD+", and the first RD value of the group G4 is arranged to be "RD+" according to the switching. As is clear from the sorted conversion tables 164-1 and 164-2 shown in FIG. 30, as the test data for performing conversions using all of the conversions of the RD+ conversions and RD− conversions of the 8b/10b code conversion table 28 regardless of the previous RD value, a test pattern having the sequence of the 8-bit data which is input data separately disposed in the groups G1, G2, G3, and G4 as input data in the sorted conversion table 164-1 and 164-2 is required to be generated.

Figure 31A:
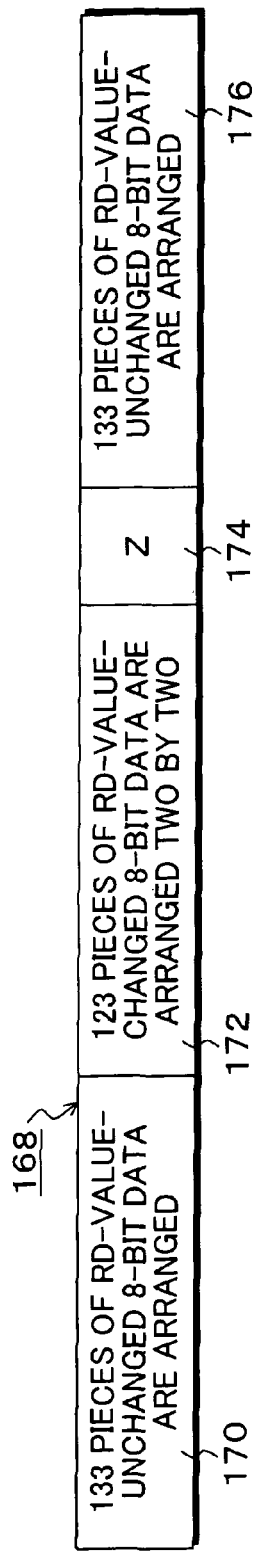
FIGS. 31A to 31C are explanatory diagrams showing the relation between the test pattern generated in accordance with sorting of FIG. 30 and RD conversions.
Figure 31B:
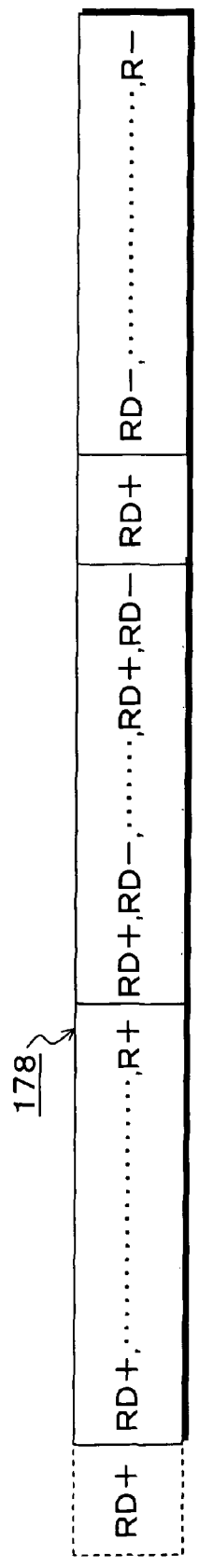
Figure 31C:
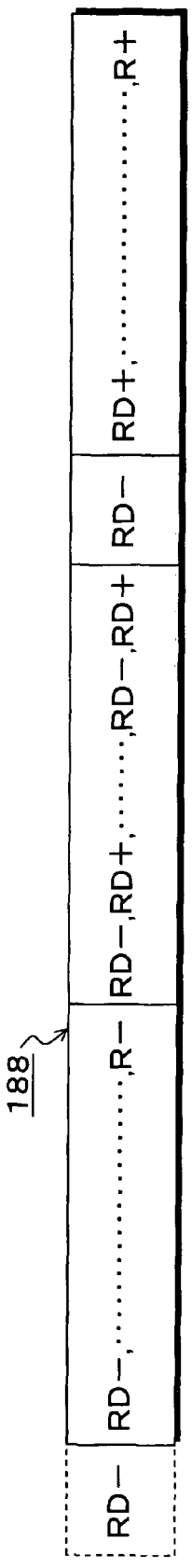

FIG. 31A is an 8-bit test data sequence 168 which is generated based on FIG. 30 and causes all the conversions of the code conversion table to be performed, wherein 133 pieces of RD value unchanged 8-bit data 170 are disposed, 123 pieces of RD value changed 8-bit data 172 are subsequently disposed two by two such that 246 pieces are disposed in total, data Z for RD switch, that is, one piece of data which belongs to the RD unchanged group is subsequently allocated, and 133 pieces of RD value unchanged 8-bit data 176 are subsequently disposed as well as the top part. When such 8-bit test data sequence 168 of FIG. 31A is caused to flow a high-speed serial transfer device using an 8b/10b code conversion table, and if the RD value immediately before the test is "RD+", RD conversions like FIG. 31B, i.e., conversions using the sorted conversion table 164-1 of FIG. 30 are performed. If the RD value immediately before the test data is "RD−", conversions using all of the RD− and Rd+ of FIG. 31C are performed. This is same as the case using the sorted conversion table 164-2 of FIG. 30.

FIG. 32 shows tables areas corresponding to the groups G1 to G4 in the 8b/10b code conversion table 28, wherein, in order to simplify the explanation, table contents are divided into the RD unchanged group and the RD changed group. As is clear from the group regions in the table, a test using all of the conversions, i.e., all of the RD− conversions and RD+ conversions of the 8b/10b code conversion table can be performed when the test data is output once.

Figure 33:
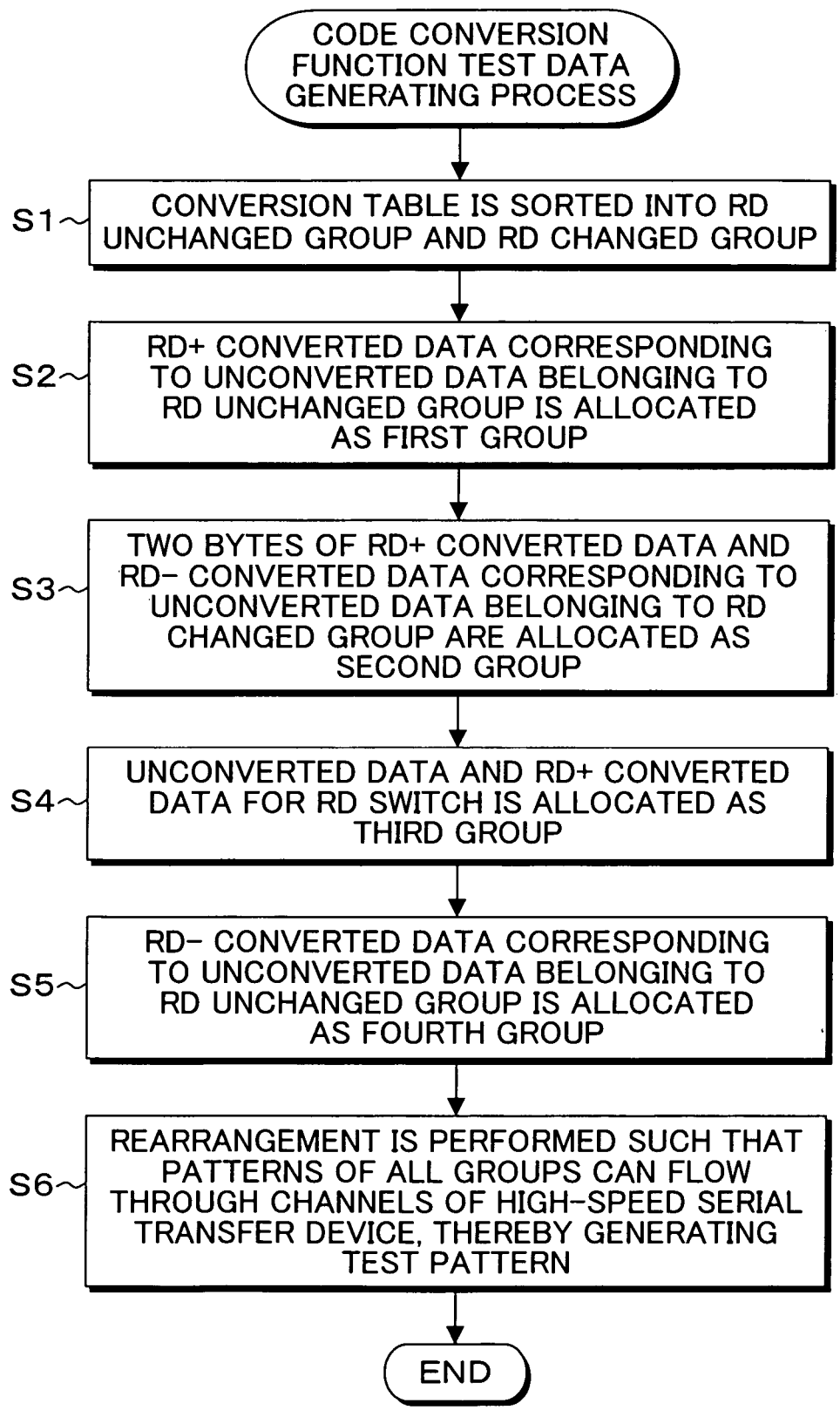
FIG. 33 is a flow chart of a test pattern generating process according to the embodiment of FIG. 27.

FIG. 33 is a flowchart of a generating process of the data of the code conversion function test in the embodiment of FIG. 27. In FIG. 33, in step S1, the code conversion table serving as a target is sorted into the RD unchanged group and the RD changed group; and, subsequently in step S2, the RD+ conversion data corresponding to the unconverted data (8-bit data) which belongs to the RD unchanged group is allocated as the first group. Subsequently in step S3, two bytes of the RD-converted data and the RD+ converted data corresponding to two pieces of the same unconverted data (8-bit data) which belongs to the RD unchanged group are continuously allocated as the second group. Subsequently in step S4, the unconverted data (8-bit data) and the RD+ converted data for RD switching is allocated as the third group. Subsequently in step S5, the RD− converted data corresponding to the unconverted data (8-bit data) which belongs to the RD unchanged group as well as step S2 is allocated as the fourth group. Finally in step S6, rearrangement is performed such that patterns of all the groups are caused to flow through each channel of the high-speed serial transfer device, thereby generating the test pattern. Regarding a function test using the thus generated test pattern for the code conversion function test, as shown in FIG. 25 or FIG. 26, the function test using all of the conversions of the RD+ conversions and RD− conversions of the code conversion table can be performed by storing the test pattern in the test pattern storage unit 138, generating a packet having the test pattern as payload, and causing it to flow through the high-speed serial transfer devices. Moreover, the present invention provides a program which generates test data for performing a test focused on mis-synchronization and a code conversion function test of a high-speed serial transfer device; and the program has the contents of the flowcharts of FIG. 16 to FIG. 24 for the test pattern for mis-synchronization, and has the contents of the flow chart of FIG. 33 for generation of the test pattern of the function test of code conversions. Although the above described embodiments employ 8b/10b code conversions as an example, they can be applied to other code conversions without modification. The present invention includes arbitrary modifications that do not impair the objects and advantages thereof, and is not limited by the numerical values shown in the above described embodiments.

What is claimed is:

1. A method of testing a high-speed serial transfer device characterized by having, comprising:

a test pattern generating step of generating a test pattern, which is input to the high-speed serial transfer device of a transmitting side where values of bits in data successively transferred to each of a plurality of serial transfer channels are the same; and a test step of examining mis-synchronization failure in a receiving side by inputting the test pattern to the high-speed serial transfer device of the transmitting side, and successively transferring the same values of bits in data that data passes through each of a plurality of serial transfer channels;

wherein the test pattern generating step has a code conversion step which has a code conversion table used in the code conversion in the high-speed serial transfer device which is an m-bit/n-bit code conversion table which converts m-bit data which is a conversion unit into n-bit data having a larger bit number, and performs two conversions comprising an RD+conversion in which running disparity in converted data is positive and an RD−conversion in which the running disparity is negative; and a basic pattern setting step which has a step of determining whether or not the converted data of the conversion unit in the m-bit/n-bit code conversion table includes a number of continuous same values in which 0 or 1 bits are equal to or more than a specified run length, if the number of continuous same values equal to or more than the specified run length is included, extracting unconverted data as the test pattern which satisfies the specified run length in one unit of the converted data, and if the number of continuous same values equal to or more than the specified run length is not included, extracting two units of unconverted data as the test pattern which satisfies the specified run length at a boundary part where the two units of the converted data are combined; and a basic pattern rearranging step of performing rearrangement in accordance with a channel usage method including a bit transfer order and a number of used channels in the high-speed serial transfer device such that the basic pattern is transferred to each of the channels.

2. The high-speed serial transfer device test method described in claim 1 characterized in that, in the two-unit test pattern extracting step, when the two units of unconverted data are (X) and (Y), the converted data of the data (X) is (X:RD−) and (X:RD+), and the converted data of the data Y is (Y:RD−) and (Y:RD+), variation of a running disparity value RD of the converted data in a data stream (XYXYXYXY...XY) obtained by cyclically successively transferring the two units of unconverted data (XY) is sorted into (1) a first case in which
the variation of the running disparity of the converted data stream of a case, in which the number of 0 bits and 1 bits of the converted data of the data X is different and the number of 0bits and 1 bits of the converted data of the data Y is the same, is a repetition of (X:RD+)(Y:RD−)(X:RD−)(Y:RD+), (2) a second case in which
the variation of the running disparity of the converted data stream of a case, in which the number of 0 bits and 1 bits of the converted data of the data X is different and the number of 0 bits and 1 bits of the converted data of the data Y is the same, is a repetition of (X:RD−)(Y:RD+)(X:RD+)(Y:RD−), (3) a third case in which
the variation of the running disparity of the converted data stream of a case, in which the number of 0 bits and 1 bits of the converted data of the data X is the same and the number of 0 bits and 1 bits of the converted data of the data Y is different, is a repetition of (X:RD+)(Y:RD+)(X:RD−)(Y:RD−), (4) a fourth case in which
the variation of the running disparity of the converted data stream of a case, in which the number of 0 bits and 1 bits of the converted data of the data X is the same and the number of 0 bits and 1 bits of the converted data of the data Y is different, is a repetition of (X:RD−)(Y:RD−)(X:RD+)(Y:RD+), (5) a fifth case in which
the variation of the running disparity of the converted data stream of a case, in which the number of 0 bits and 1 bits of the converted data of both the data X and Y is different, is a repetition of (X:RD+)(Y:RD−), (6) a sixth case in which
the variation of the running disparity of the converted data stream of a case, in which the number of 0 bits and 1 bits of the converted data of both the data X and Y is different, is a repetition of (X:RD−)(Y:RD+), (7) a seventh case in which
the variation of the running disparity of the converted data stream of a case, in which the number of 0 bits and 1 bits of the converted data of both the data X and Y is the same, is a repetition of (X:RD+)(Y:RD+), and (8) an eighth case in which
the variation of the running disparity of the converted data stream of a case, in which the number of 0 bits and 1 bits of the converted data of both the data X and Y is the same, is a repetition of (X:RD−)(Y:RD−); and the two units of unconverted data which satisfy the specified run length at the boundary part are extracted as the test pattern separately in each of the cases.

3. The method according to claim 1 characterized in that, in the two-unit test pattern extracting step, the two units of unconverted data which satisfy the specified run length at the boundary part of the two units of conversion data are extracted as the test pattern in a manner corresponding to each of a first byte order method which employs a bit sequence in which an end side has a lower significant bit in the high-speed serial transfer device and a second byte order method which employs a bit sequence in which the end side has a higher significant bit.

4. The method according to claim 1 characterized in that, when the high-speed serial transfer device has an 8-bit/10-bit code conversion table for the code conversion, in the two-unit test pattern extracting step, XY=F4EB or EBF4 in hexadecimal display is determined as the basic pattern.

5. The method according to claim 1 characterized in that, in the basic pattern resetting step, the basic pattern is reset to data before bit transfer order control to provide the basic pattern such that the basic pattern enables the data transferred in accordance with the bit transfer order control in which transfer order is determined separately for odd-numbered bits and even-numbered bits in the high-speed serial transfer device to satisfy a specified run length.

6. The method according to claim 5 characterized in that, in the basic pattern resetting step, when, in the two-unit test pattern extracting step, XY=F4EB or XY=EBF4 in hexadecimal display is determined as the basic pattern from an 8-bit/10-bit code conversion table of the high-speed serial transfer device, the basic pattern is reset in accordance with the bit transfer order control, in which odd-numbered bits are transferred first and even-numbered bits are subsequently transferred, to the reset basic pattern which is XY=E9CF or XY=CFE9 in hexadecimal display.

7. The method according to claim 1 characterized in that, in the basic pattern rearranging step, the basic pattern (X) of one unit or the basic pattern (XY) of two units is rearranged such that the basic pattern is continued in the number of the channels of the high-speed serial transfer device.

8. The method according to claim 7 characterized in that, in the basic pattern rearranging step, when the high-speed serial transfer device has four channels, the one-unit basic pattern (X) is rearranged to repetitions of the basic pattern (XXXX), and the two-unit basic pattern (XY) is rearranged to repetitions of the basic pattern (XXXXYYYY).

9. The method according to claim 7 characterized in that, in the basic pattern resetting step, when, in the two-unit test pattern extracting step, (F4EB) or (EBF4)

in hexadecimal display is determined as the basic pattern from an 8-bit/10-bit code conversion table of the high-speed serial transfer device, and when the high-speed serial transfer device has four channels, the basic pattern is rearranged to a repetition of (F4F4F4F4EBEBEBEBEB) or a repetition of (EBEBEBEBEBF4F4F4F4).

10. A method of testing a high-speed serial transfer device which has a code conversion table where data is converted to transfer to each of a plurality of serial transfer channels, comprising:

- a test pattern generating step of generating a test pattern such that all of data stored in a code conversion table is successively transferred to each of a plurality of serial transfer channels of the high-speed serial transfer device; and
- a test step for examining a function of a receiving side by inputting the test pattern to the high-speed serial transfer device of a transmitting side and successively transferring all of the data of the code conversion table such that the data passes through each of the plurality of serial transfer channels;

wherein the test pattern generating step has

- a group sorting step of sorting the code conversion table into a RD unchanged group in which a number of 0 bits and 1 bits of converted data is a same number and which does not cause running disparity of subsequent converted data to be changed, and an RD changed group in which the number of 0 bits and 1 bits of the converted data is different and which causes running disparity of the subsequent converted data to be changed;
- a data allocating step of forming a first group by disposing units of the unconverted data of the RD unchanged group one by one, then forming a second group by disposing units of same data of the unconverted data of the RD unchanged group two by two, subsequently forming a third group by disposing one unit of predetermined unconverted data which belongs to the RD changed group, and further forming a fourth group by disposing units of the unconverted data of a no RD group one by one, so as to generate the test pattern; and
- a test pattern rearranging step of rearranging the test pattern such that all the converted data is transferred to each of the channels in accordance with a number of used channels in the high-speed serial transfer device.

11. The method according to claim 10 characterized in that, if the code conversion table is an 8-bit/10-bit code conversion table,

- in the group sorting step, the 8-bit/10-bit code conversion table is sorted into the RD unchanged group including 133 variations and the RD changed group including 123 variations; and,
- in the data allocating step, the first group is formed by disposing units of 8-bit data of the 133 variations of the RD unchanged group one by one, the second group is then formed by disposing units of 8-bit data of the 123 variations of the RD changed group two by two, the third group is subsequently formed by disposing merely one unit of predetermined 8-bit data which belongs to the RD changed group, and the fourth group is formed by disposing units of 8-bit data of the 133 variations of a no RD group one by one, so as to generate the test pattern.

12. The method according to claim 10 characterized in that, in the test pattern rearranging step, one unit of unconverted pattern (X) or two units of the unconverted pattern (XX) is rearranged such that the pattern of one unit is continued in the number of the channels in the high-speed serial transfer device.

* * * * *

UNITED STATES PATENT AND TRADEMARK OFFICE
CERTIFICATE OF CORRECTION

| | | |
|---|---|---|
| PATENT NO. | : 7,853,849 B2 | |
| APPLICATION NO. | : 11/398615 | |
| DATED | : December 14, 2010 | |
| INVENTOR(S) | : Tetsuo Kurayama | |

It is certified that error appears in the above-identified patent and that said Letters Patent is hereby corrected as shown below:

Col. 25, line 28, delete "0bits" and insert --0 bits--.

Signed and Sealed this
Twenty-second Day of March, 2011

David J. Kappos
*Director of the United States Patent and Trademark Office*